(12) United States Patent
Yoon et al.

(10) Patent No.: US 8,581,346 B2
(45) Date of Patent: Nov. 12, 2013

(54) SEMICONDUCTOR MEMORY DEVICE

(75) Inventors: HongSik Yoon, Seongnam-si (KR); Jinshi Zhao, Seoul (KR); Ingyu Baek, Seoul (KR); Hyunjun Sim, Hwaseong-si (KR); Minyoung Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 507 days.

(21) Appl. No.: 12/822,302

(22) Filed: Jun. 24, 2010

(65) Prior Publication Data
US 2011/0012081 A1    Jan. 20, 2011

(30) Foreign Application Priority Data

Jul. 20, 2009    (KR) .................. 10-2009-0065952

(51) Int. Cl.
  *H01L 21/8229* (2006.01)
  *H01L 27/108* (2006.01)
  *H01L 27/11* (2006.01)

(52) U.S. Cl.
  CPC ............................... *H01L 21/8229* (2013.01)
  USPC ............... 257/368; 257/296; 257/E21.209; 257/E21.645; 257/E21.655; 257/E21.665; 438/57

(58) Field of Classification Search
  USPC ............. 977/742; 257/E27.084–E27.103, 68, 257/296, 368, E21.209, E21.645–E21.694; 438/3, 57
  See application file for complete search history.

(56) References Cited

U.S. PATENT DOCUMENTS

| | | | |
|---|---|---|---|
| 4,162,538 A | 7/1979 | Thornburg | |
| 6,331,944 B1 | 12/2001 | Monsma et al. | |
| 6,643,158 B2 | 11/2003 | McDonald et al. | |
| 6,646,912 B2 | 11/2003 | Hurst et al. | |
| 6,858,883 B2 | 2/2005 | Fricke et al. | |
| 7,256,063 B2 | 8/2007 | Pinkerton et al. | |
| 7,352,607 B2 | 4/2008 | Furukawa et al. | |
| 7,382,647 B1 | 6/2008 | Gopalakrishnan | |
| 7,466,523 B1 * | 12/2008 | Chen | 360/324.1 |
| 7,741,638 B2 * | 6/2010 | Stewart et al. | 257/48 |
| 7,825,408 B2 * | 11/2010 | Kaeriyama et al. | 257/41 |
| 7,867,814 B2 * | 1/2011 | Nihei et al. | 438/102 |
| 8,125,824 B1 * | 2/2012 | Ward et al. | 365/182 |
| 8,148,709 B2 * | 4/2012 | Delaet et al. | 257/4 |

(Continued)

FOREIGN PATENT DOCUMENTS

WO    WO2007130919    11/2007

OTHER PUBLICATIONS

Zhan-Chun Tu et al., "Single-walled and multiwalled carbon nanotubes viewed as elastic tubes with the effective Young's moduli dependent on layer number", Physical Review B, vol. 65, 233407, 2002.

(Continued)

*Primary Examiner* — Laura M Menz
*Assistant Examiner* — Maliheh Malek
(74) *Attorney, Agent, or Firm* — F. Chau & Associates, LLC

(57) ABSTRACT

A semiconductor memory device includes a first conductive line, a second conductive line crossing over the first conductive line, a resistance variation part disposed at a position in which the second conductive line intersects with the first conductive line and electrically connected to the first conductive line and the second conductive line and a mechanical switch disposed between the resistance variation part and the second conductive line. The mechanical switch includes a nanotube.

20 Claims, 37 Drawing Sheets

(56) References Cited

U.S. PATENT DOCUMENTS

| | | | |
|---|---|---|---|
| 2004/0219773 A1* | 11/2004 | Choi et al. | 438/597 |
| 2005/0001529 A1* | 1/2005 | Kang et al. | 313/310 |
| 2007/0025138 A1* | 2/2007 | Furukawa et al. | 365/151 |
| 2007/0222357 A1* | 9/2007 | Dijon et al. | 313/311 |
| 2007/0257246 A1* | 11/2007 | Bakkers et al. | 257/2 |
| 2008/0237858 A1* | 10/2008 | Nihei | 257/746 |
| 2008/0246149 A1* | 10/2008 | Kwak et al. | 257/751 |
| 2008/0247226 A1* | 10/2008 | Liu et al. | 365/163 |
| 2008/0296551 A1* | 12/2008 | Nihei et al. | 257/2 |
| 2009/0001348 A1* | 1/2009 | Kaeriyama et al. | 257/4 |
| 2009/0003039 A1 | 1/2009 | Naito | |
| 2009/0020742 A1* | 1/2009 | Sunamura et al. | 257/4 |
| 2009/0242868 A1* | 10/2009 | Kurotsuchi et al. | 257/4 |
| 2009/0250775 A1* | 10/2009 | Delaet et al. | 257/421 |
| 2009/0289322 A1* | 11/2009 | Moon et al. | 257/485 |
| 2010/0034016 A1* | 2/2010 | Liu | 365/163 |
| 2010/0108972 A1* | 5/2010 | Zhao et al. | 257/2 |
| 2011/0001115 A1* | 1/2011 | Greene et al. | 257/4 |
| 2011/0073833 A1* | 3/2011 | Nihei et al. | 257/4 |
| 2012/0280201 A1* | 11/2012 | Sekar et al. | 257/4 |

OTHER PUBLICATIONS

Sae-Won Lee et al., "MEMS Mechanical Logic Units: Characterization and Improvements of Devices Fabricated with MicraGEM and PolyMUMPS", Proc. of SIPE, vol. 6037, 2005.

Yoshihiro Sato et al., "Sub-100-μA Reset Current of Nickel Oxide Resistive Memory Through Control of Filamentary Conductance by Current Limit of MOSFET", IEEE Transactions on Electron Devices, vol. 55, No. 5, 1185-1191, May 2008.

* cited by examiner

SEMICONDUCTOR MEMORY DEVICE

CROSS-REFERENCE TO RELATED APPLICATIONS

This U.S. non-provisional patent application claims priority under 35 U.S.C. §119 of Korean Patent Application No. 10-2009-0065952, filed on Jul. 20, 2009, the disclosure of which is hereby incorporated by reference herein in it's entirety.

BACKGROUND

The present inventive concept herein relates to a semiconductor memory device.

As semiconductor devices are highly integrated, semiconductor memory devices may be required to be miniaturized and have high data storage capacity. Further, semiconductor memory devices may be required to have high operation speed and to be driven at low power. To this end, various types of research are being carried out.

A typical semiconductor memory device may include a number of memory cells that are connected to each other to constitute circuits. A dynamic random access memory (DRAM), which is a representative semiconductor memory device, has a unit memory cell that includes a transistor and a capacitor. Such a DRAM may have a high degree of integration and high operation speed. However, after power is cut off, all data stored in the DRAM is lost.

A flash memory is a representative example of nonvolatile memory devices capable of retaining data even after power is cut off. Although the flash memory is nonvolatile, the flash memory may not be highly integrated and may have low operation speed as compared with DRAMs.

For theses reasons, much research have been conducted for developing and improving other nonvolatile memory devices such as magnetic random access memories (MRAMs), ferroelectric random access memories (FRAMs), and phase-change random access memories (PRAMs).

SUMMARY

The present inventive concept may provide a highly integrated semiconductor memory device that can prevent a leakage current to an unselected memory cell.

Embodiments of the inventive concept provide semiconductor memory devices including: a first conductive line; a second conductive line crossing over the first conductive line, a resistance variation part disposed at a position in which the second conductive line crosses the first conductive line and the resistance variation part is electrically connected to the first conductive and the second conductive line and a mechanical switch is disposed between the resistance variation part and the second conductive line. The mechanical switch includes a nanotube.

In some embodiments, the semiconductor memory devices may include a conductive pad disposed between the resistance variation part and the second conductive line and having an upper portion on which the nanotube is disposed.

In other embodiments, the resistance variation part may include one of a phase-change material film pattern, a magnetic tunnel junction structure pattern including a pinned layer, a tunneling layer, and a free layer, which are sequentially stacked, a metal oxide film pattern and a solid electrolyte film pattern.

In still other embodiments, the resistance variation part may be the phase-change material film pattern, the semiconductor memory device may further include a dielectric film that is disposed between the conductive pad and the phase-change material film pattern and has a contact window, and the conductive pad and the phase-change material film pattern may contact each other through the contact window. The phase-change material film pattern and the dielectric film may have side walls aligned with each other. The phase-change material film pattern and the dielectric film may have side walls aligned with a side wall of the first conductive line. The phase-change material film pattern and the dielectric film may have a line shape overlapping the first conductive line.

In even other embodiments, the resistance variation part may be the solid electrolyte film pattern, and one of the conductive pad and the first conductive line may include a metal film having a tendency to diffuse a metal ion into the solid electrolyte film pattern.

In yet other embodiments, the semiconductor memory device may further include an interlayer dielectric film that covers side walls of at least the first conductive line, the resistance variation part, and the conductive pad and has a first opening part exposing an upper surface of the conductive pad, wherein the nanotube is disposed in the first opening part.

In further embodiments, a second distance between a side wall of the first opening part and the second conductive line may be greater than a first distance between the nanotube and the interlayer dielectric film.

In still further embodiments, the second distance may be equal to or greater than two times the first distance.

In even further embodiments, the second conductive line may include: one of a second opening part disposed at a position in which the second opening part overlaps the first opening part, and having a greater width than that of the first opening part; and a laterally curved region of a side surface surrounding a part of side walls of the first opening part.

In yet further embodiments, when a voltage is applied to the first and second conductive lines, the nanotubes may contact the second conductive line to turn the mechanical switch on.

In accordance with another embodiment of the inventive concept, a semiconductor memory device is provided. The semiconductor memory device includes a buffer film disposed on a semiconductor substrate, a first conductive line extending across the semiconductor substrate and disposed on the buffer layer, a resistance variation part disposed on the first conductive line, a conductive pad disposed on the resistance variation part and an interlayer dielectric film covering sidewalls of the first conductive line, the resistance variation part and the conductive pad. The interlayer dielectric film includes a first opening part that partially exposes the upper surface of the conductive pad. The semiconductor memory device further includes a second conductive line that extends on the interlayer dielectric film and crosses an upper side of the first conductive line and a mechanical switch which includes a plurality of carbon nanotubes which are vertically elongated and disposed on the upper surface of the conductive pad exposed by the first opening part.

BRIEF DESCRIPTION OF THE DRAWINGS

The accompanying figures are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Figure 1:
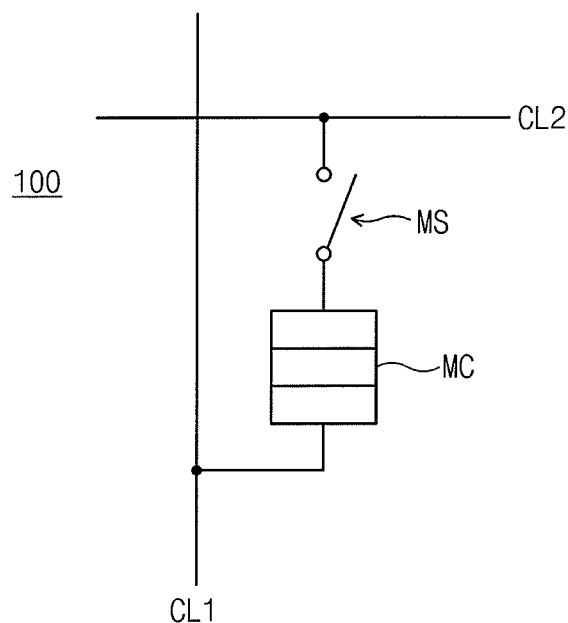
FIG. 1 is a unit circuit diagram of a semiconductor memory device according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be through and complete, and will fully convey the scope of the inventive concept to those skilled in the art. In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Like reference numerals refer to like elements throughout.

FIG. 1 is a unit circuit diagram of a semiconductor memory device according to an embodiment of the inventive concept.

Referring to FIG. 1, in a semiconductor memory device 100 according to the current embodiment, a resistance variation memory cell MC is connected in series to a mechanical switch MS at a position where a first conductive line CL1 crosses a second conductive line CL2.

A First Embodiment

Figure 2A:
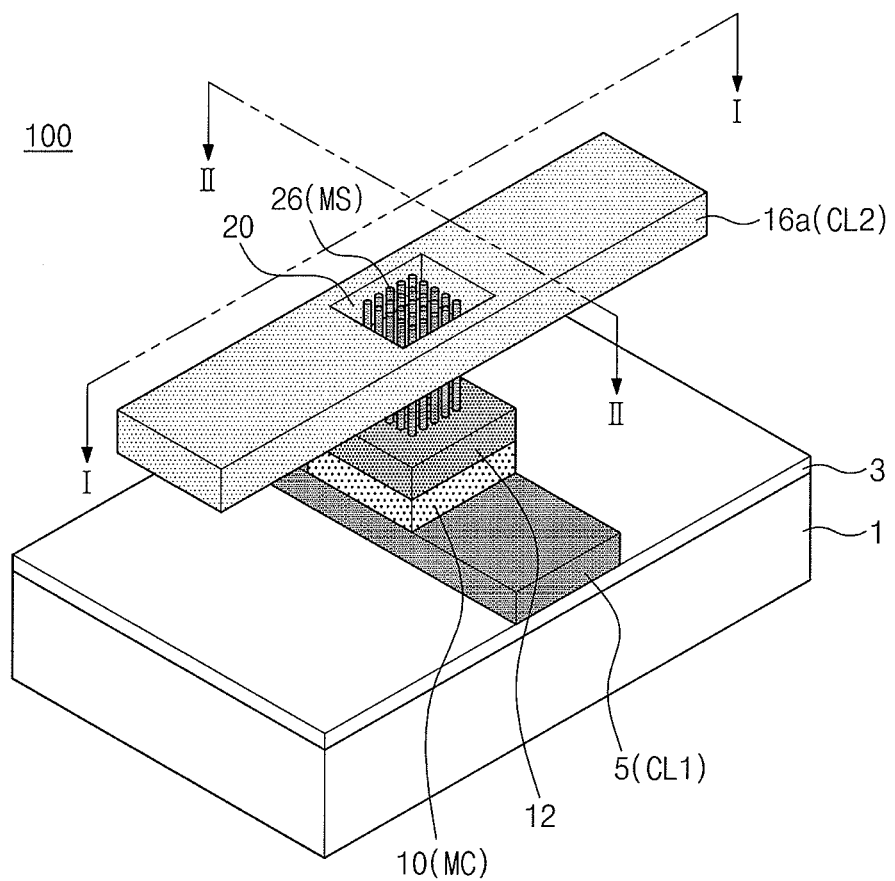
FIG. 2A is a perspective view illustrating a memory device according to an embodiment of the inventive concept.
Figure 2B:
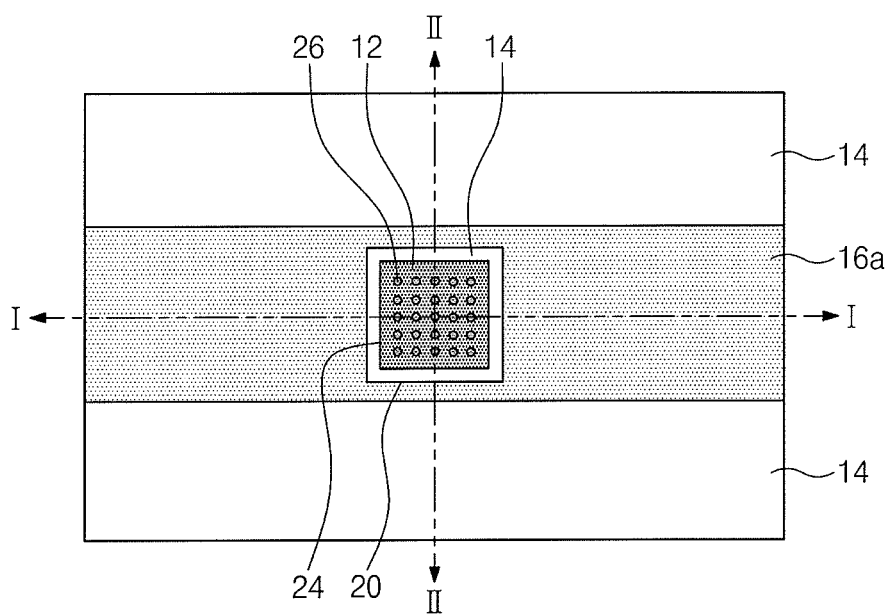
FIG. 2B is a plan view illustrating the memory device of FIG. 2A.
Figure 2C:
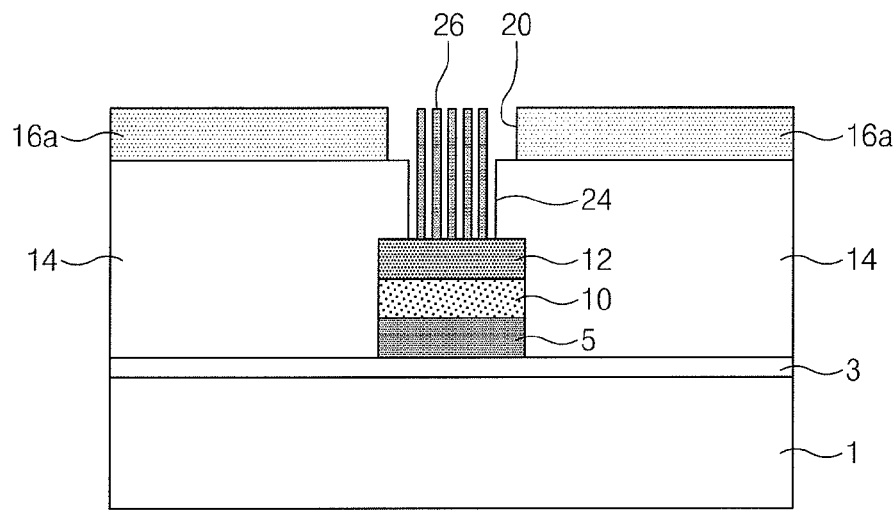
FIG. 2C is a cross-sectional view taken along line I-I of FIG. 2A or 2B.
Figure 2D:
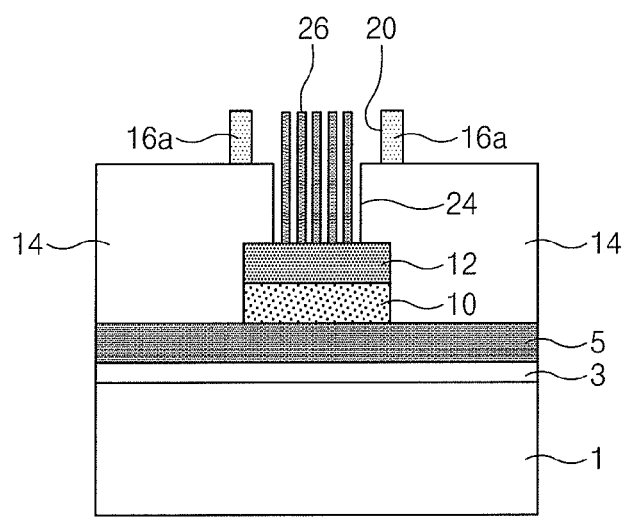
FIG. 2D is a cross-sectional view taken along line II-II of FIG. 2A or 2B.

FIG. 2A is a perspective view illustrating a memory device according to a first embodiment of the inventive concept. FIG. 2B is a plan view illustrating the memory device of FIG. 2A. FIG. 2C is a cross-sectional view taken along line I-I of FIG. 2A or 2B. FIG. 2D is a cross-sectional view taken along line II-II of FIG. 2A or 2B. For clearer understanding, an interlayer dielectric film 14 illustrated in FIGS. 2B through 2D is omitted in FIG. 2A.

Referring to FIGS. 2A through 2D, in the semiconductor memory device 100, a buffer film 3 is disposed on a semiconductor substrate 1. A first conductive line (CL1) 5 extending across the semiconductor substrate 1 is disposed on the buffer film 3. Although the first conductive line 5 is disposed on the buffer film 3 in the current embodiment, the first conductive line 5 may be formed as, for example, an impurity implantation region formed by implanting impurities into an active region that is limited by a device isolation film.

A resistance variation part (MC) 10 and a conductive pad 12 are sequentially disposed on a predetermined region of the first conductive line 5. Side walls of the resistance variation part 10 may be aligned with those of the conductive pad 12. The side walls of the first conductive line 5, the resistance variation part 10, and the conductive pad 12 may be covered with the interlayer dielectric film 14. The interlayer dielectric film 14 may include a first opening part 24 that partially exposes the upper surface of the conductive pad 12. A second conductive line (CL2) 16a may extend on the interlayer dielectric film 14, and may cross the upper side of the first conductive line 5. In the current embodiment, the second conductive line 16a may have a second opening part 20 that overlaps the first opening part 24 and is wider than the first opening part 24. Nanotubes (MS) 26, which are vertically elongated, may be disposed on the upper surface of the conductive pad 12 exposed by the first opening part 24. The nanotubes 26 may be carbon nanotubes.

The resistance variation part 10 may be a phase transition pattern. In this case, the semiconductor memory device 100 may be, for example, a phase-change RAM (PRAM). Alternatively, the resistance variation part 10 may be a magnetic tunnel junction structure pattern that includes a pinned layer, a tunneling layer, and a free layer, which are sequentially stacked. In this case, the semiconductor memory device 100 may be, for example, a magnetic RAM (MRAM).

The resistance variation part 10 may include, for example, a metal oxide layer pattern or a solid electrolyte film pattern. In this case, the semiconductor memory device 100 may be, for example, a resistance RAM (ReRAM). Especially, when the resistance variation part 10 is a solid electrolyte film pattern, the semiconductor memory device 100 may be referred to as a conductive bridging random access memory (CBRAM). In this case, one of the conductive pad 12 and the first conductive line 5 may include a metal film that diffuses metal ions to the solid electrolyte film pattern. The other of the conductive pad 12 and the first conductive line 5 may be, for example, an inert electrode. Semiconductor memory devices according to types of the resistance variation part 10 will be described in detail in the following embodiments.

The semiconductor memory device 100 of FIGS. 2A through 2D may include a unit cell, and such unit cells may be repeatedly disposed back and forth and laterally. That is, the first conductive line 5 may extend along the line II-II to contact a plurality of resistance variation parts 10 that are isolated from each other, and the second conductive line 16a may extend along the line I-I to be adjacent to a plurality of the nanotubes 26 through the second opening part 20.

Figure 3A:
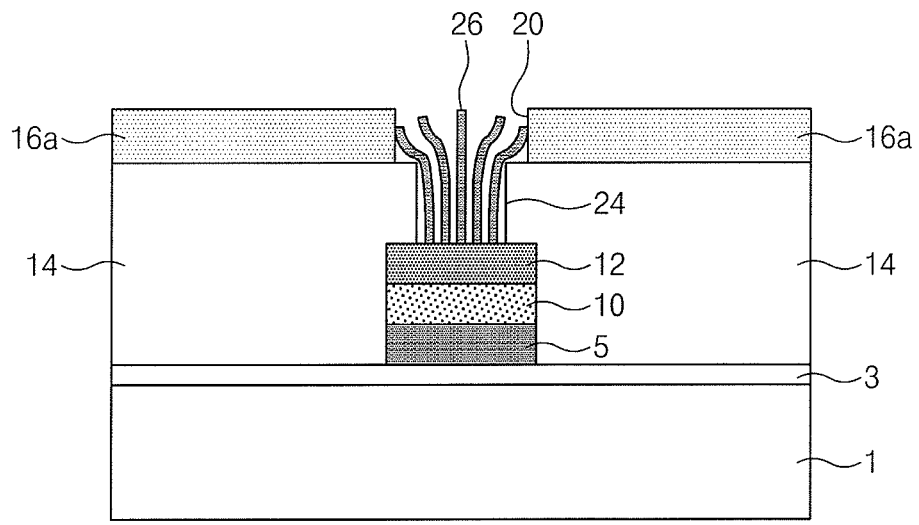
FIGS. 3A and 3B are cross-sectionals views illustrating an operation of a nanotube switch when a voltage is applied to the semiconductor memory device corresponding to FIGS. 2C and 2D, respectively.
Figure 3B:
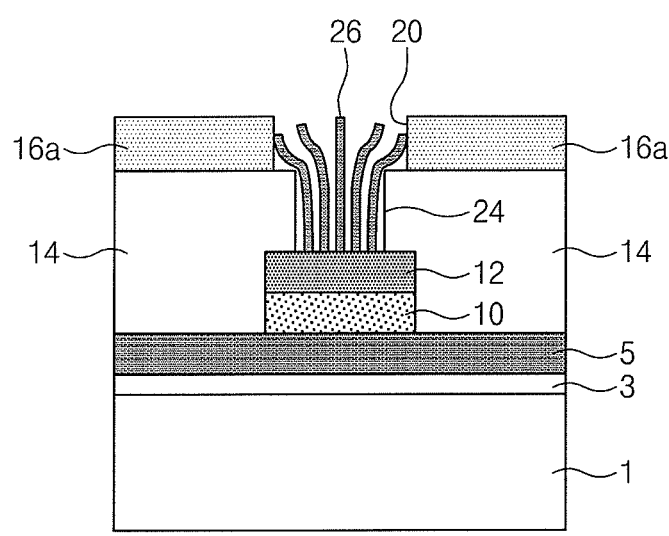

FIGS. 3A and 3B are cross-sectionals views illustrating an operation of a nanotube switch when a voltage is applied to the semiconductor memory device corresponding to FIGS. 2C and 2D, respectively.

A voltage may be applied to the first conductive line 5 and the second conductive line 16a in the semiconductor memory device 100 of FIGS. 2A through 2D. For example, a voltage of about 0 V may be applied to the first conductive line 5, and a voltage of about 0.5 V or greater may be applied to the second conductive line 16a. Accordingly, as shown in FIGS. 3A and 3B, ends of the nanotubes 26 may have a tendency to bend toward the second conductive line 16a by the Coulomb force. At this time, the nanotubes 26 may have a tendency to return to their original positions by elastic force. When the Coulomb force due to a voltage application is greater than the elastic force, the ends of the nanotubes 26 may be brought to contact the second conductive line 16a. When the ends of the nanotubes 26 contact the second conductive line 16a, the Coulomb force may be continually applied, and further, the van der Waals force may be applied between the second conductive line 16a and the ends of the nanotubes 26, and thus, the ends of the nanotubes 26 may have a tendency to continually contact the second conductive line 16a. When the voltage is cut off from the first and second conductive lines 5 and 16a, the nanotubes 26 may return to their original positions by the elastic force, and thus, may go away from the second conductive line 16a. According to this principle, the nanotubes 26 may function as a switch.

Figure 4:
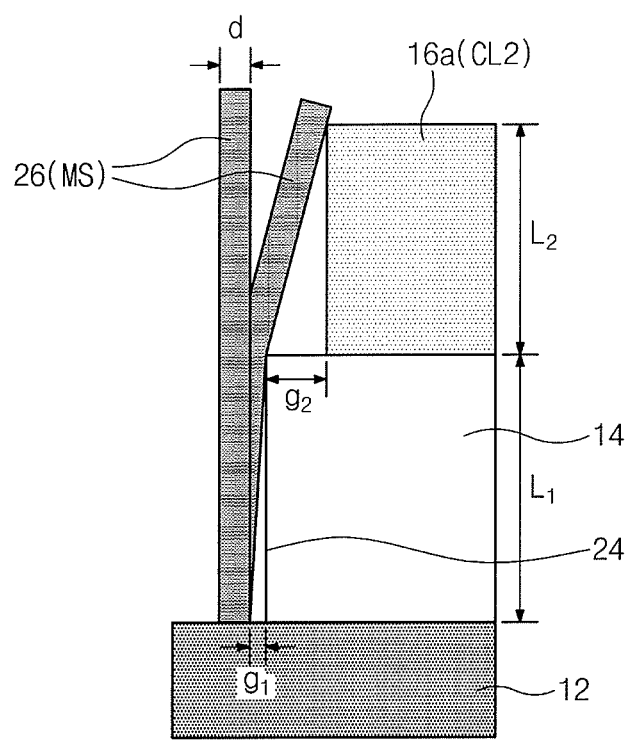
FIG. 4 is an enlarged view illustrating a portion of FIG. 2C.

FIG. 4 is an enlarged view illustrating a portion of FIG. 2C.

Referring to FIG. 4, the distance between the nanotubes 26 and the interlayer dielectric film 14 is referred to as a first distance $g_1$, and the distance between the side wall of the first opening part 24 and the second conductive line 16a is referred to as a second distance $g_2$. The height between the lower ends of the nanotubes 26 and the upper surface of the interlayer dielectric film 14 is referred to as a first length $L_1$, and the thickness of the second conductive line 16a is referred to as a second length $L_2$. For example, structures surrounding the nanotubes 26 may be designed such that a switching function is efficiently performed. That is, the first and second distances $g_1$, and $g_2$, and the first and second lengths $L_1$ and $L_2$ are appropriately designed such that, when a voltage is cut off from the first conductive line 5 and the second conductive line 16a, the elastic force of the nanotubes 26 is greater than the van der Waals force applied between the second conductive line 16a and the ends of the nanotubes 26 to restore the nanotubes 26 to their original positions.

For example, a voltage applied to the second conductive line 16a when a voltage of about 0 V is applied to the conductive pad 12, that is, a first voltage $V_{PI}$ (pull-in voltage) attracting the nanotubes 26 such that the upper ends of the nanotubes 26 are bent toward the second conductive line 16a and contact the second conductive line 16a may be expressed as Equation (1).

$$V_{PI} = \sqrt{\frac{8k\left(g_1 + \frac{L_2}{L_1}g_1\right)^3}{27\varepsilon_0 d(L_1 + L_2)}} + \sqrt{\frac{8k\left(g_1 - \frac{L_2}{L_1}g_1\right)^3}{27\varepsilon_0 d L_2}} \quad (1)$$

where d is the thickness of the nanotubes 26, k is modulus of elasticity of the nanotubes 26, and $\varepsilon_0$ is permittivity of the nanotubes 26.

The first distance $g_1$ is a probabilistic value obtained while forming the nanotubes 26. That is, the first distance $g_1$ is an arbitrary value where catalyst nanoparticles for forming carbon nanotubes exist on the upper surface of the conductive pad 12. Thus, it may be very difficult to arbitrarily adjust the first distance $g_1$. However, as the second distance $g_2$ is the distance from the side wall of the first opening part 24 to the second conductive line 16a, it may be relatively easy to arbitrarily adjust the second distance $g_2$ while forming the second conductive line 16a. As the first voltage $V_{PI}$ is calculated using the first distance $g_1$ that is an arbitrary value, it may be difficult to constantly adjust the first voltage $V_{PI}$, and the first voltage $V_{PI}$ may slightly vary according to positions. That is, dispersion of the first voltage $V_{PI}$ may increase.

When it is assumed that influences according to the first distance $g_1$ that is an arbitrary value are removed, that is, when it is assumed that the first distance $g_1$ and the first length $L_1$ are removed, a second voltage $V_{PI0}$ attracting the nanotubes 26 only when the second distance $g_2$ and the second length $L_2$ exist may be expressed as Equation (2).

$$V_{PI0} = \sqrt{\frac{8k g_2^3}{27\varepsilon_0 d L_2}} \quad (2)$$

Figure 5:
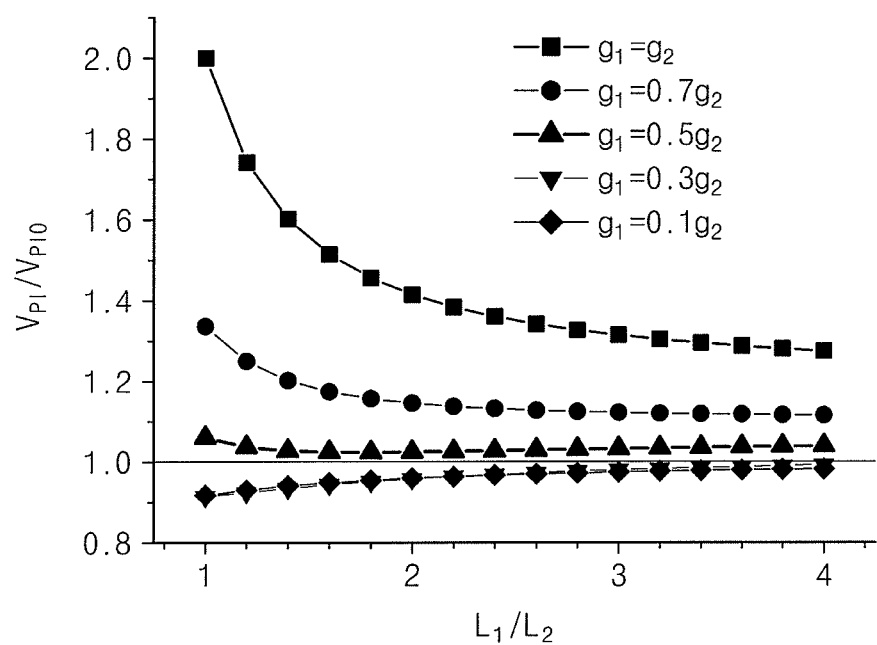
FIG. 5 is a graph illustrating operation characteristics of the nanotube switch of FIG. 4.

A relationship between the first voltage $V_{PI}$ and the second voltage $V_{PI0}$, a relationship between the first distance $g_1$ and the first length $L_1$, and a relationship between the second distance $g_2$ and the second length $L_2$ are illustrated in FIG. 5.

Referring to FIG. 5, when $g_1 \leq 0.5 g_2$, $V_{PI}/V_{PI0}$ is constantly about 1, regardless of $L_1/L_2$. That is, when the second distance $g_2$ sufficiently increases to be equal to or greater than about two times the first distance $g_1$, the first and second voltages $V_{PI}$ and $V_{PI0}$ are substantially the same, regardless of the first and second lengths $L_1$ and $L_2$. Accordingly, dispersion of the first voltage $V_{PI}$ can be reduced, and a semiconductor memory device including nanotubes functioning as a stable switch can be formed.

Next, a process of manufacturing the semiconductor memory device of FIGS. 2A through 2D will now be described. FIGS. 6A, 7A, 8A, 9A, 10A, 11A, 12A, 13A and 14A are plan views sequentially illustrating a process of forming the semiconductor memory device illustrated FIG. 2B. FIGS. 6B, 7B, 8B, 9B, 10B, 11B, 12B, 13B and 14B are cross-sectional views taken along line I-I of FIGS. 6A, 7A, 8A, 9A, 10A, 11A, 12A, 13A and 14A, respectively, which sequentially illustrate a process of forming the semiconductor memory device illustrated in FIG. 2C. FIGS. 6C, 7C, 8C, 9C, 10C, 11C, 12C, 13C and 14C are cross-sectional views taken along line II-II of FIGS. 6A, 7A, 8A, 9A, 10A, 11A, 12A, 13A and 14A, respectively, which sequentially illustrate a process of forming the semiconductor memory device illustrated in FIG. 2D.

Figure 6A:
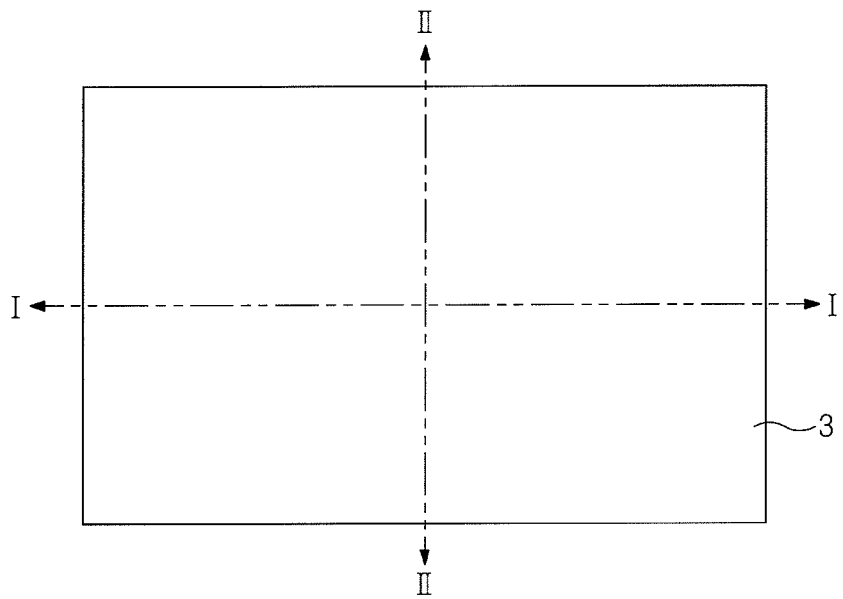
FIGS. 6A, 7A, 8A, 9A, 10A, 11A, 12A, 13A and 14A are plan views sequentially illustrating a process of forming the semiconductor memory device illustrated FIG. 2B.
Figure 6B:
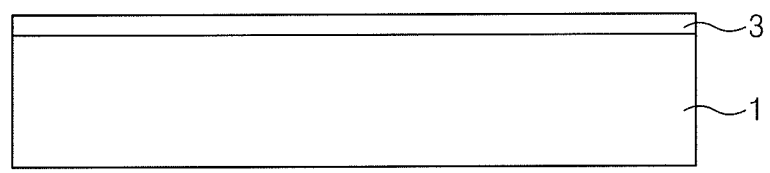
FIGS. 6B, 7B, 8B, 9B, 10B, 11B, 12B, 13B and 14B are cross-sectional views taken along line I-I of FIGS. 6A, 7A, 8A, 9A, 10A, 11A, 12A, 13A and 14A, respectively, which sequentially illustrate a process of forming the semiconductor memory device illustrated in FIG. 2C.
Figure 6C:
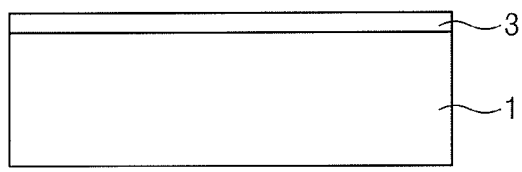
FIGS. 6C, 7C, 8C, 9C, 10C, 11C, 12C, 13C and 14C are cross-sectional views taken along line II-II of FIGS. 6A, 7A, 8A, 9A, 10A, 11A, 12A, 13A and 14A, respectively, which sequentially illustrate a process of forming the semiconductor memory device illustrated in FIG. 2D.

Referring to FIGS. 6A, 6B and 6C, the buffer film 3 may be formed on the semiconductor substrate 1. The buffer film 3 may be, for example, a thermal oxide film. In addition, before forming the buffer film 3, structures such as, for example, a device isolation film and a well may be formed.

Figure 7A:
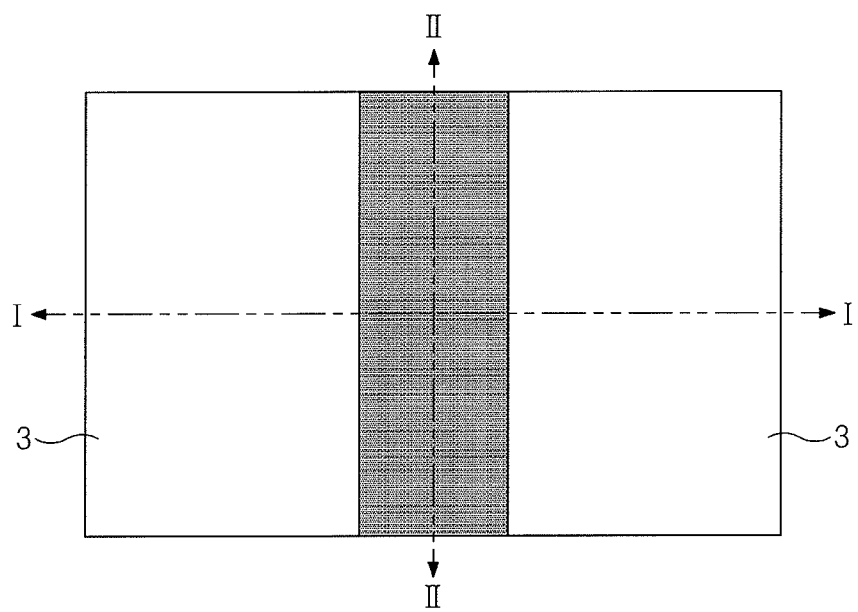
Figure 7B:
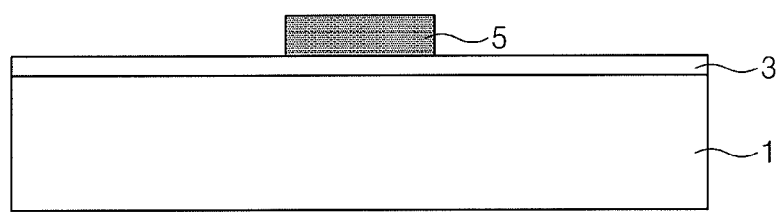
Figure 7C:
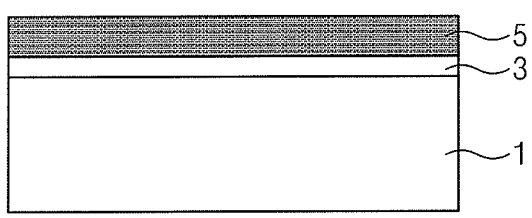

Referring to FIGS. 7A, 7B and 7C, the first conductive line 5 extending across the semiconductor substrate 1 may be formed on the buffer film 3. For example, the first conductive line 5 may be parallel to the line II-II. For example, the first conductive line 5 may be formed by forming a conductive film entirely on the buffer film 3 and by patterning the conductive film. Although the first conductive line 5 extends across the upper side of the buffer film 3 in the current embodiment, the first conductive line 5 may be replaced with, for example, an impurity implantation region that is formed in an active region limited by a device isolation film in a semiconductor substrate.

Figure 8A:
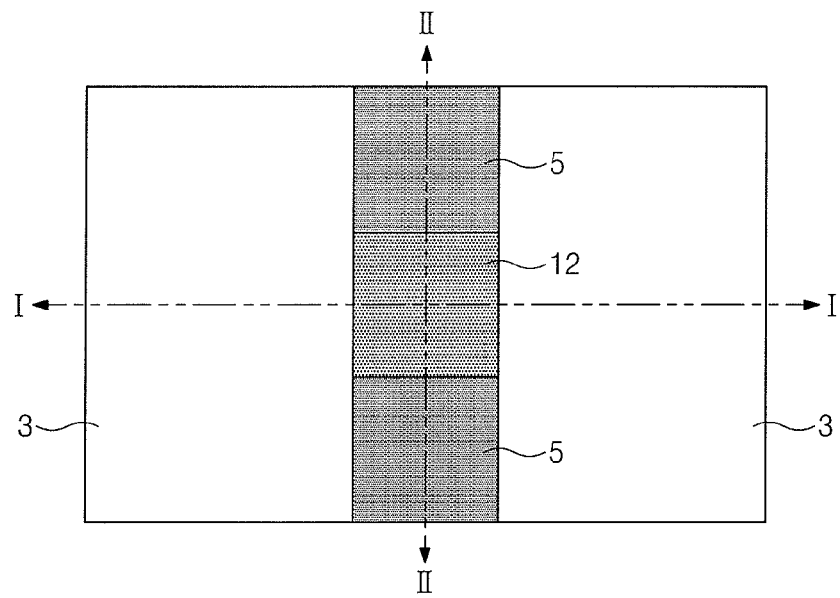
Figure 8B:
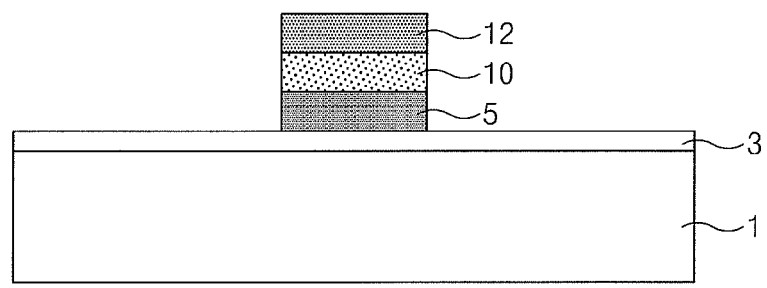
Figure 8C:
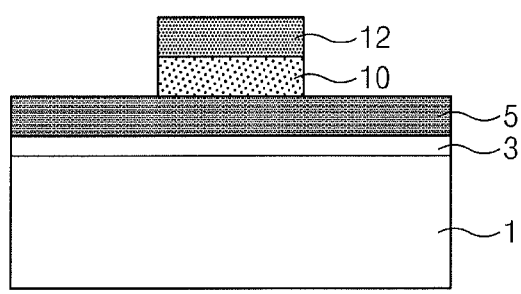

Referring to FIGS. 8A, 8B and 8C, the resistance variation part 10 and the conductive pad 12 may be sequentially stacked on the first conductive line 5. The resistance variation part 10 may include, for example, a phase-change material film, a metal oxide film, a solid electrolyte film, or a structure of a magnetic film, a dielectric film and a magnetic film, which are sequentially stacked. For example, to form the resistance variation part 10 and the conductive pad 12, a phase-change material film, a metal oxide film, or a solid electrolyte film, which constitutes the resistance variation part 10, may be entirely formed, and a conductive film constituting the conductive pad 12 may be stacked entirely on the resistance variation part 10, and then, the conductive pad 12 and the resistance variation part 10 may be sequentially patterned. Alternatively, for example, to form the resistance variation part 10 and the conductive pad 12, a magnetic film, a dielectric film, and a magnetic film, which constitute the resistance variation part 10, may be sequentially and entirely stacked, and a conductive film constituting the conductive pad 12 may be stacked entirely on the magnetic film, the dielectric film, and the magnetic film. Then, the conductive pad 12 and the resistance variation part 10 may be sequentially patterned. In this operation, a catalyst for forming carbon nanotubes may be formed in advance on the conductive pad 12.

Figure 9A:
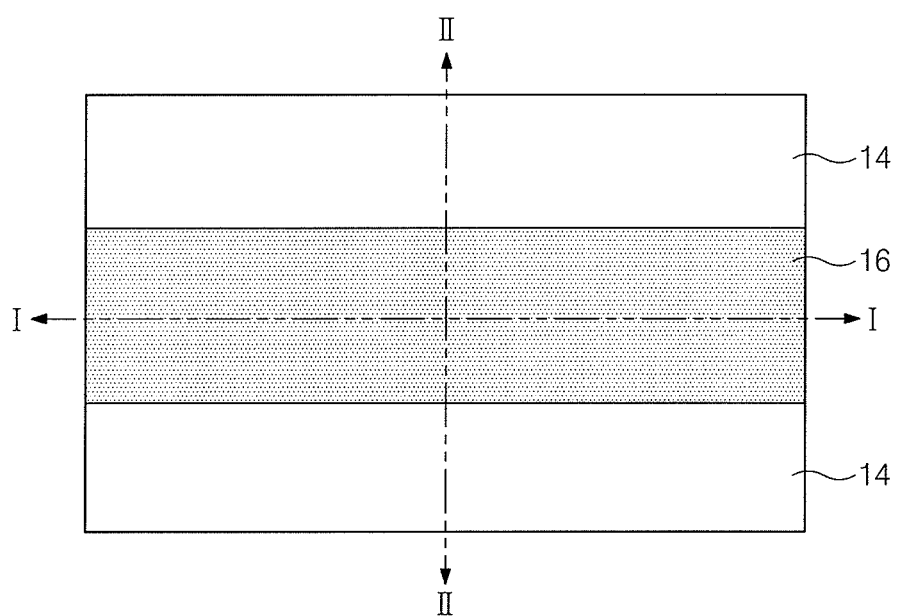
Figure 9B:
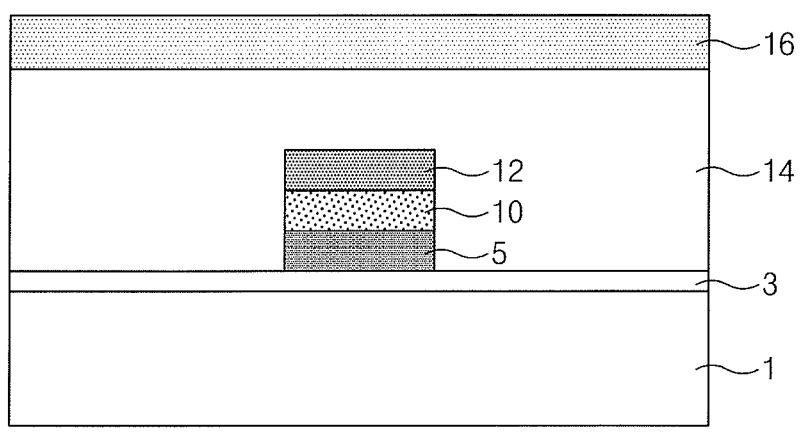
Figure 9C:
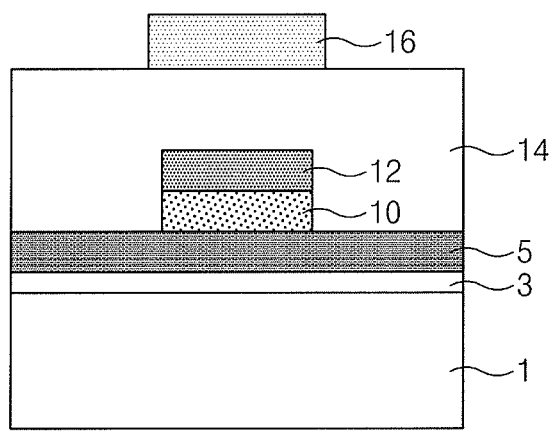

Referring to FIGS. 9A, 9B and 9C, the interlayer dielectric film 14 may be stacked entirely on the semiconductor substrate 1 provided with the resistance variation part 10 and the conductive pad 12. Then, a second conductive line 16, which crosses the upper side of the first conductive line 5, may be formed on the interlayer dielectric film 14.

Figure 10A:
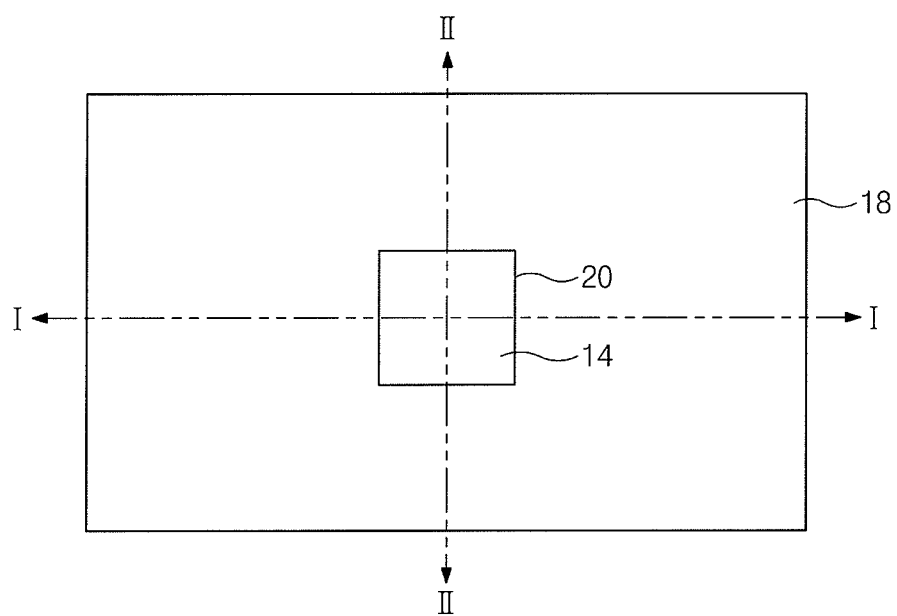
Figure 10B:
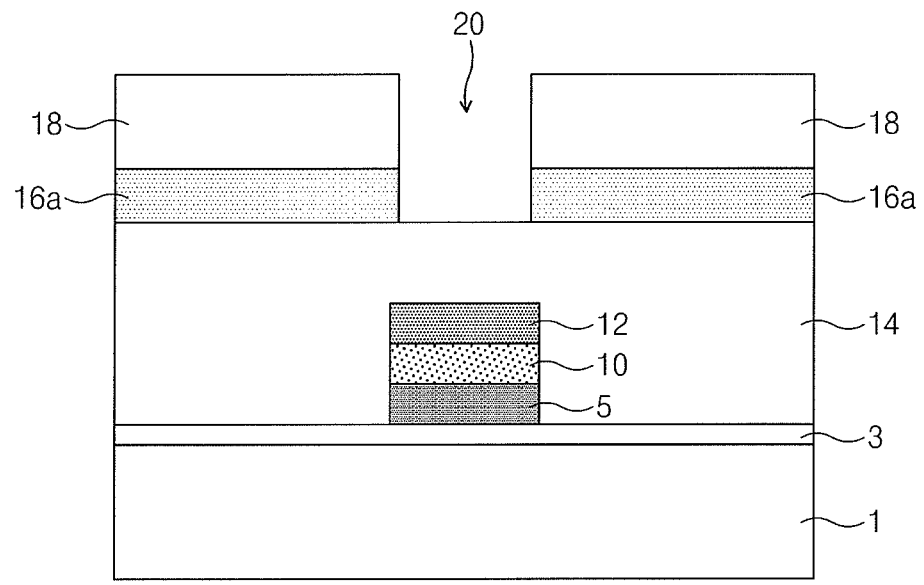
Figure 10C:
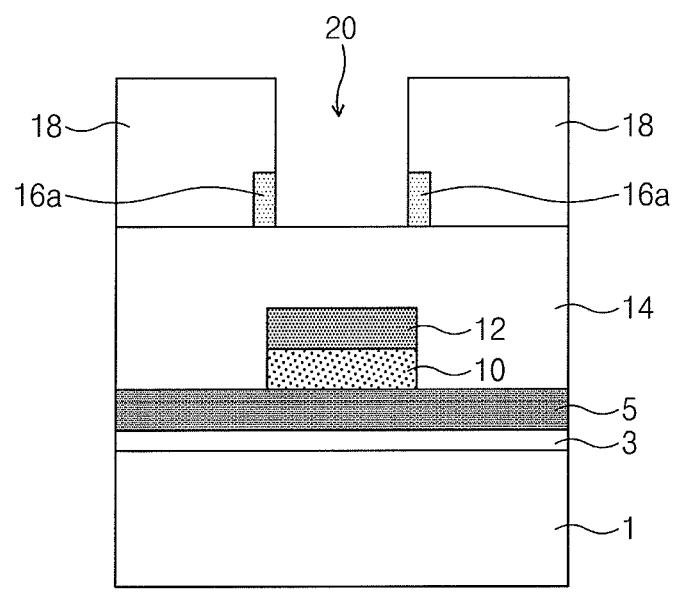

Referring to FIGS. 10A, 10B and 10C, a sacrificial layer 18 covering the second conductive line 16 may be stacked on the entire surface of the semiconductor substrate 1. Then, the sacrificial layer 18 and the second conductive line 16 may be continuously patterned to form the second opening part 20 that exposes the upper surface of the interlayer dielectric film 14 in a region overlapping the conductive pad 12. Accordingly, the second conductive line 16a having the second opening part 20 may be formed.

Figure 11A:
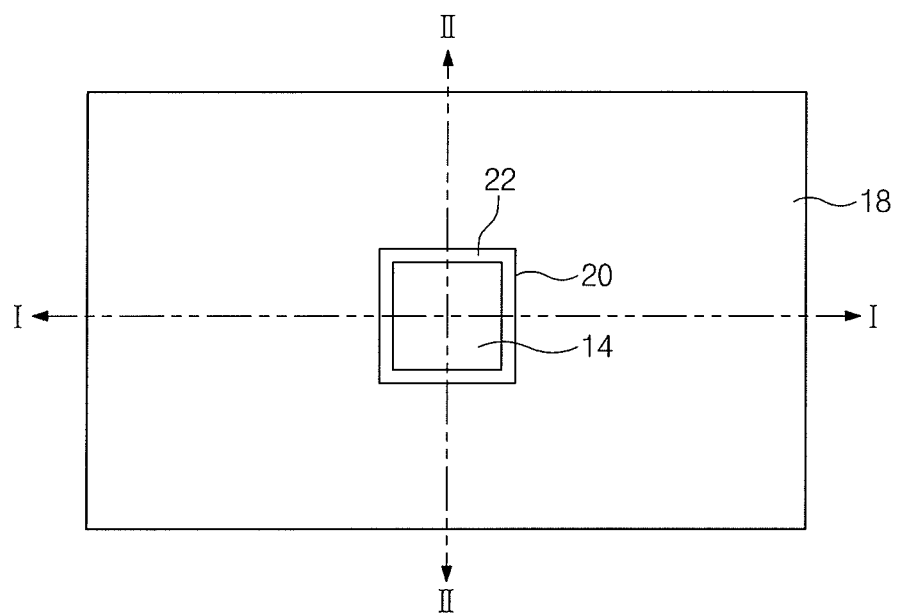
Figure 11B:
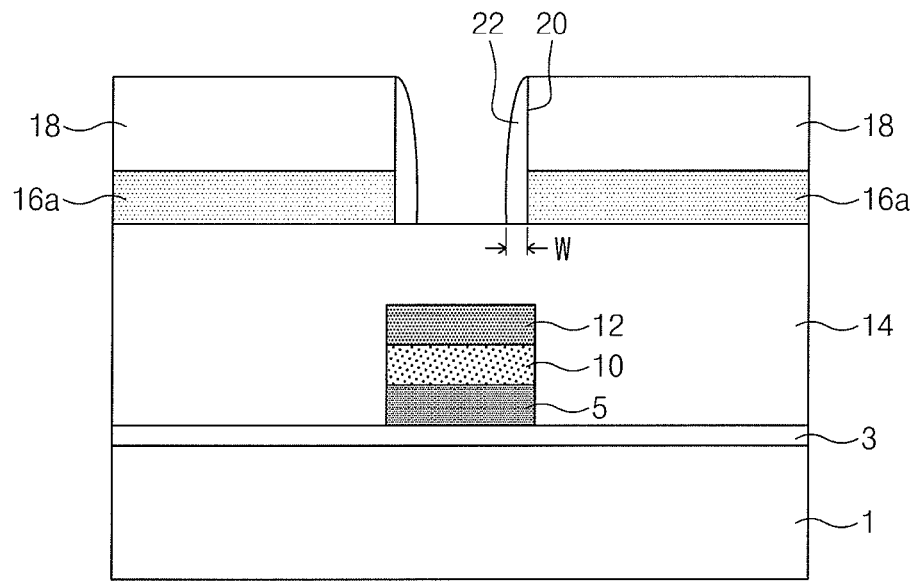
Figure 11C:
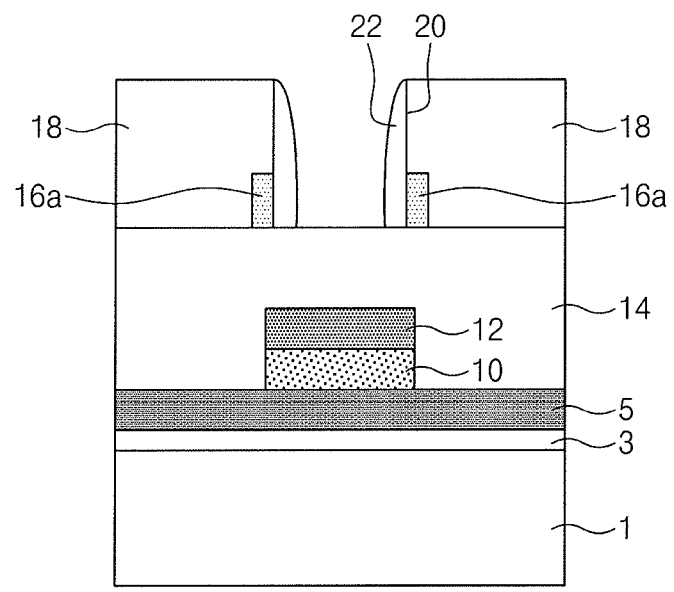

Referring to FIGS. 11A, 11B and 11C, a spacer 22 covering the side wall of the second opening part 20 may be formed.

The spacer 22 may be foamed, for example, by entirely foaming a spacer film, and then, by anisotropically etching the spacer film. A width W of the spacer 22 may be determined according to the thickness of the spacer film. The width W of the spacer 22 may correspond to the second distance $g_2$ in a following process.

Figure 12A:
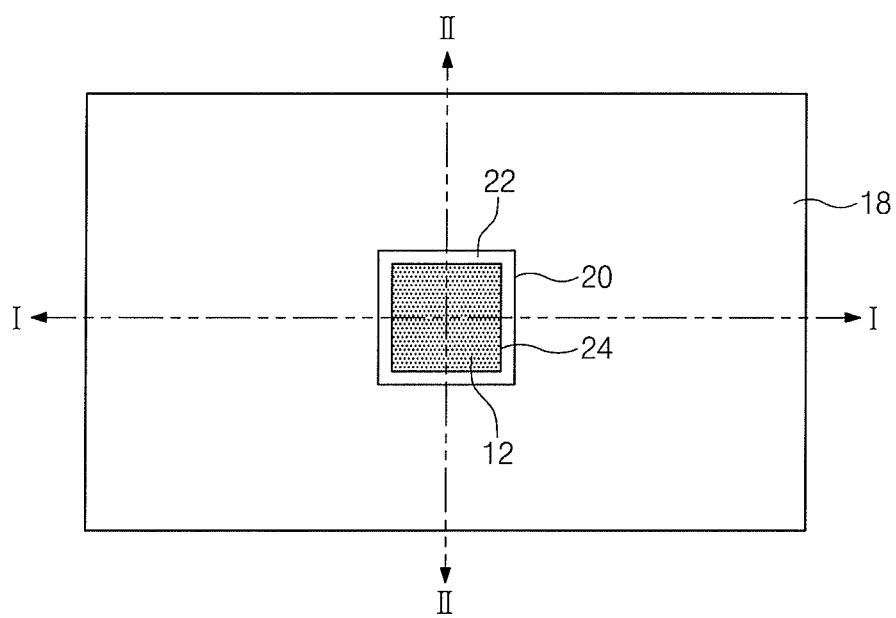
Figure 12B:
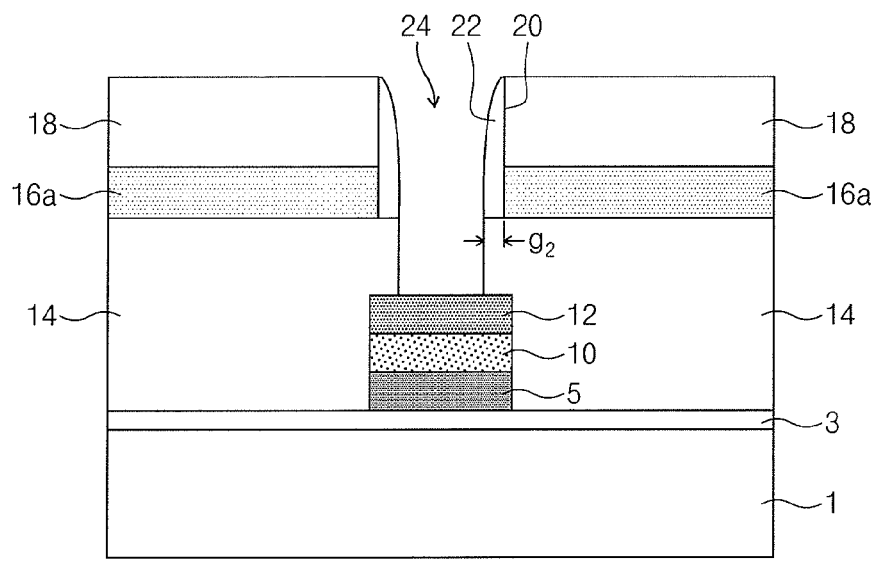
Figure 12C:
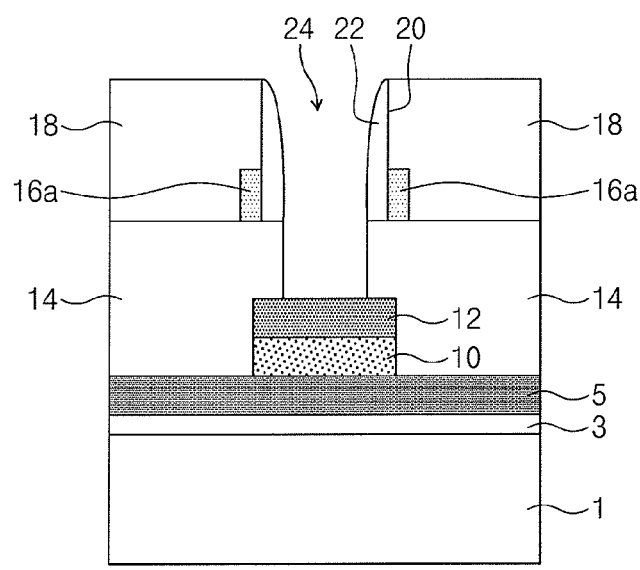

Referring to FIGS. 12A, 12B and 12C, the spacer 22 and the sacrificial layer 18 may be used as an etching mask to etch the interlayer dielectric film 14 exposed by the spacer 22 in the bottom of the second opening part 20. Accordingly, a first opening part 24 partially exposing the upper surface of the conductive pad 12 may be formed in the interlayer dielectric film 14.

Figure 13A:
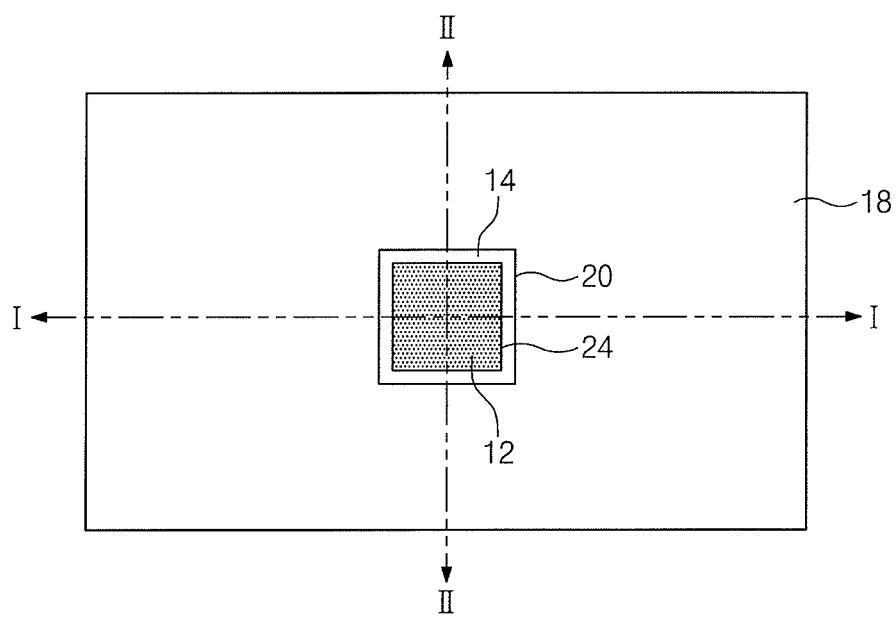
Figure 13B:
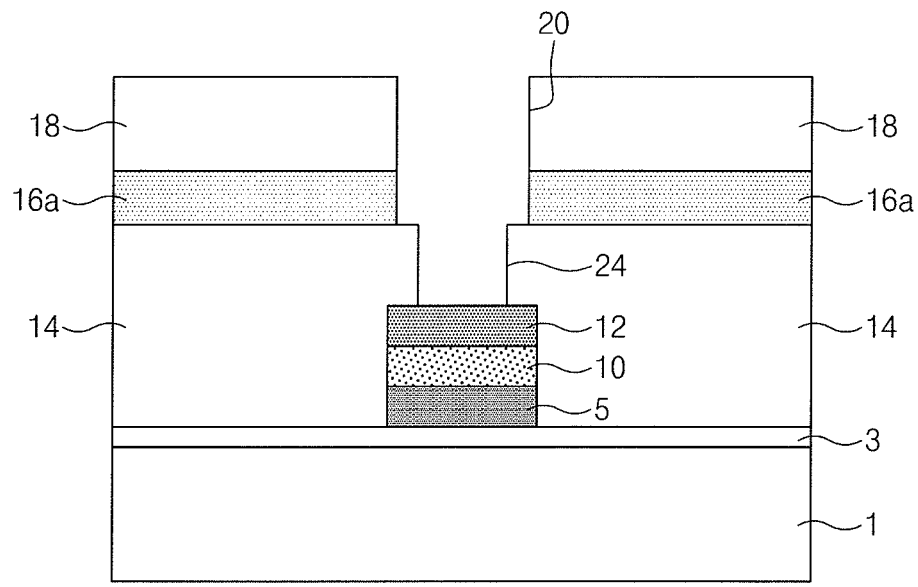
Figure 13C:
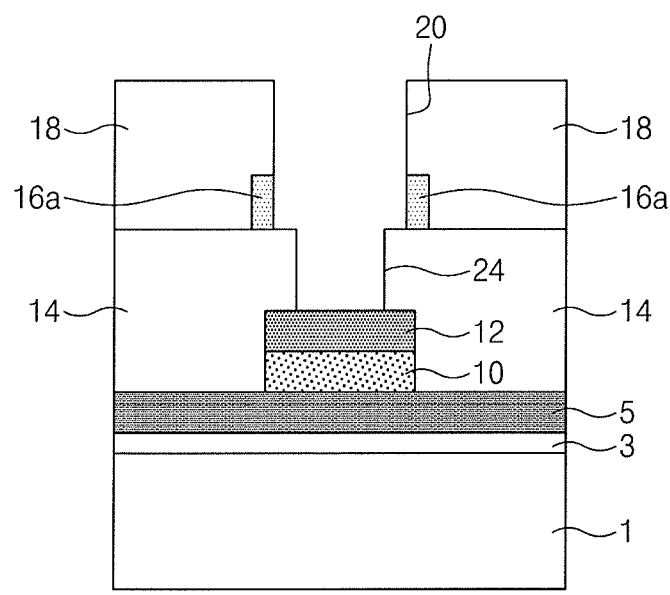

Referring to FIGS. 13A, 13B and 13C, the spacer 22 may be removed. A process of removing the spacer 22 may be, for example, a wet etching process. In this case, the exposed upper surface of the conductive pad 12 may be cleaned.

Figure 14A:
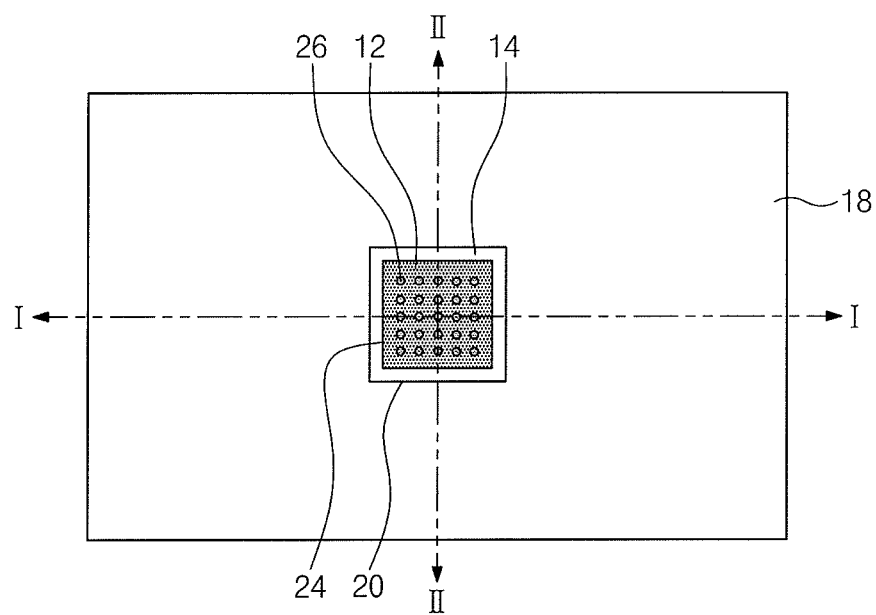
Figure 14B:
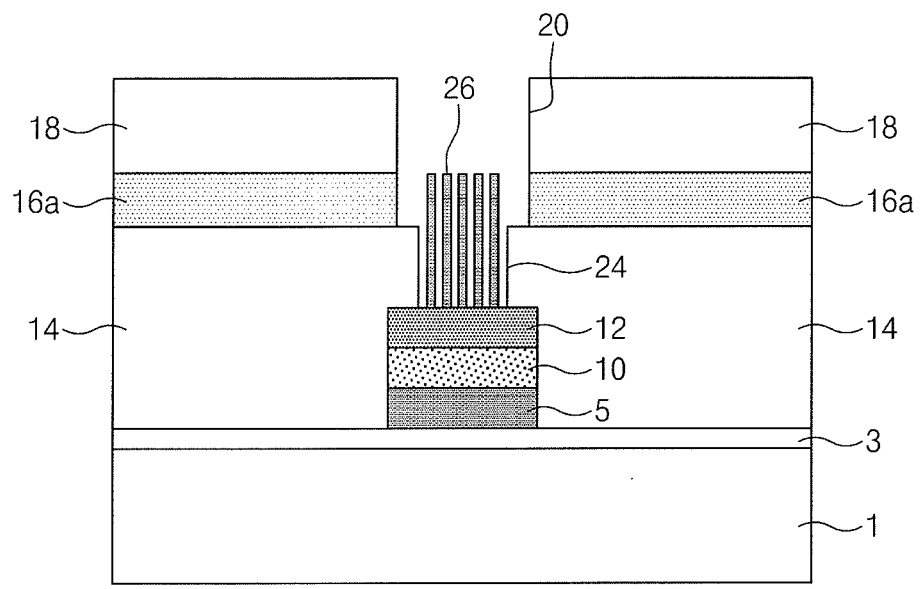
Figure 14C:
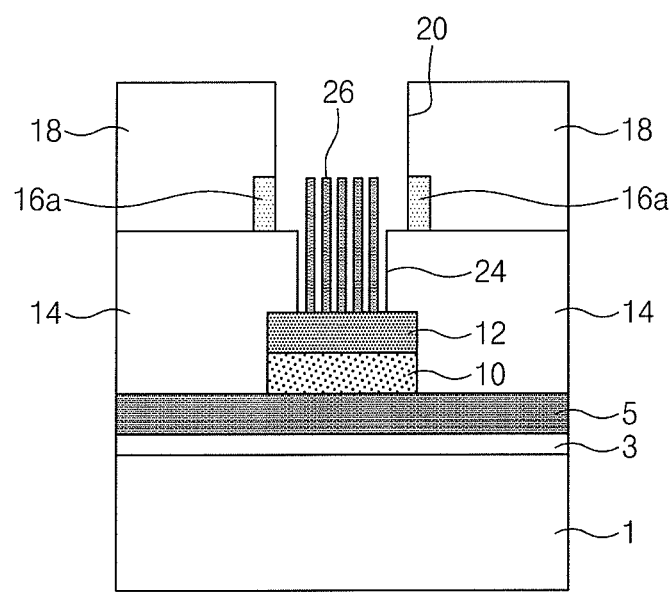

Referring to FIGS. 14A, 14B and 14C, the nanotubes 26 may be formed on the exposed upper surface of the conductive pad 12. A process of forming the nanotubes 26 may be as follows. First, catalyst nanoparticles for growing carbon nanotubes may be formed on the exposed upper surface of the conductive pad 12. To form the catalyst nanoparticles only on the exposed upper surface of the conductive pad 12, the rest surfaces except for the exposed upper surface of the conductive pad 12 may be treated to be hydrophobic. The catalyst nanoparticles may be metal nanoparticles, which may be formed, e.g., of iron, cobalt, nickel, chrome, vanadium, platinum, or palladium. After the catalyst nanoparticles are formed, the carbon nanotubes may be grown to form the nanotubes 26. At this point, for example, hydrocarbon, carbon monoxide, or carbon dioxide may be used as a carbon source.

Although the spacer 22 is removed as illustrated in FIGS. 13A, 13B and 13C, the spacer 22 may be removed after forming the nanotubes 26. In this case, as the spacer 22 makes an entrance of the first opening part 24 narrow, it may be difficult to efficiently supply gas functioning as the carbon source.

After the nanotubes 26 are formed, the sacrificial layer 18 may be removed to complete the semiconductor memory device as illustrated in FIGS. 2A through 2D.

Figure 15:
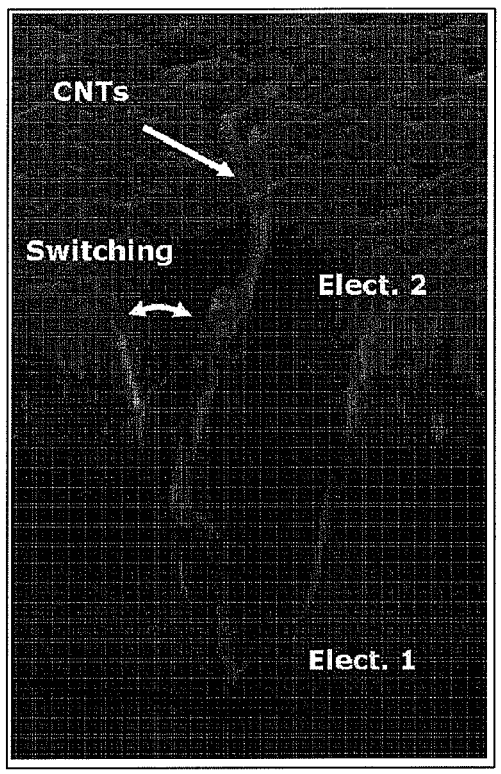
FIG. 15 is an image illustrating a cross-section of a semiconductor memory device manufactured according to an embodiment of the inventive concept.

FIG. 15 is an image illustrating a cross-section of a semiconductor memory device manufactured using the above-describe method. Referring to FIG. 15, nanotubes CNTs are formed on a conductive pad Elect. 1, and ends of the nanotubes CNTs are adjacent to a second conductive line Elect. 2 for switching.

Figure 16:
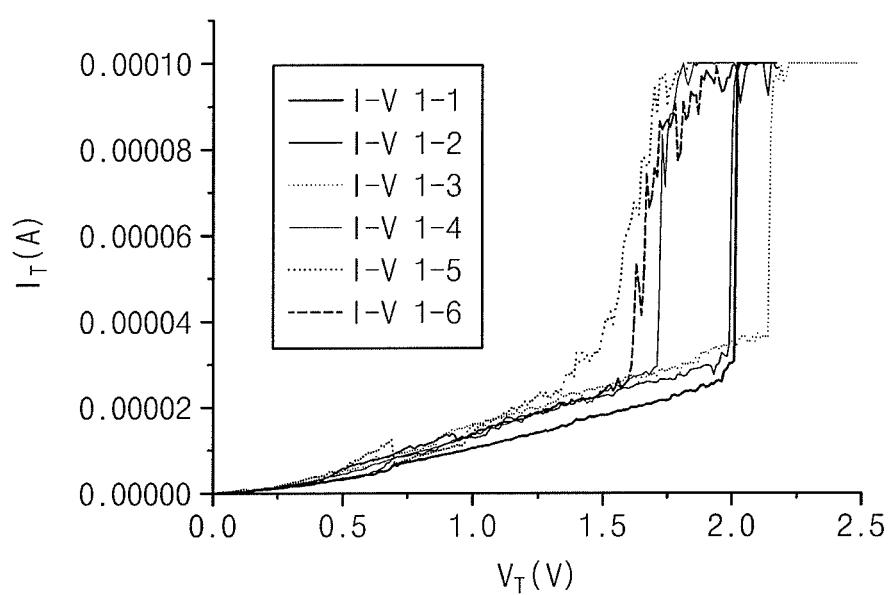
FIG. 16 is an I-V graph of a semiconductor memory device manufactured according to an embodiment of the inventive concept.

FIG. 16 is a graph illustrating currents measured according to variation in a voltage $V_T$ applied to the second conductive line 16a with a voltage of about 0 V being applied to the first conductive line 5 in the semiconductor memory device manufactured using the above-described method, as illustrated in FIGS. 2A and 2B. Referring to FIG. 16, 'I-V 1-1' is a current (I)—voltage (V) graph measured in a first experiment, and 'I-V 1-6' is a current (I)—voltage (V) graph measured in a sixth experiment. That is, 'I-V 1-1' through 'I-V 1-6' graphs are current (I)—voltage (V) graphs measured in first through sixth experiments, respectively. As a current may quickly increase when a voltage ranging from about 1.5 V to about 2.0 V is applied to the second conductive line 16a as illustrated in FIG. 16, it is understood that the ends of the nanotubes 26 may contact the second conductive line 16a in this range.

A Second Embodiment

Figure 17A:
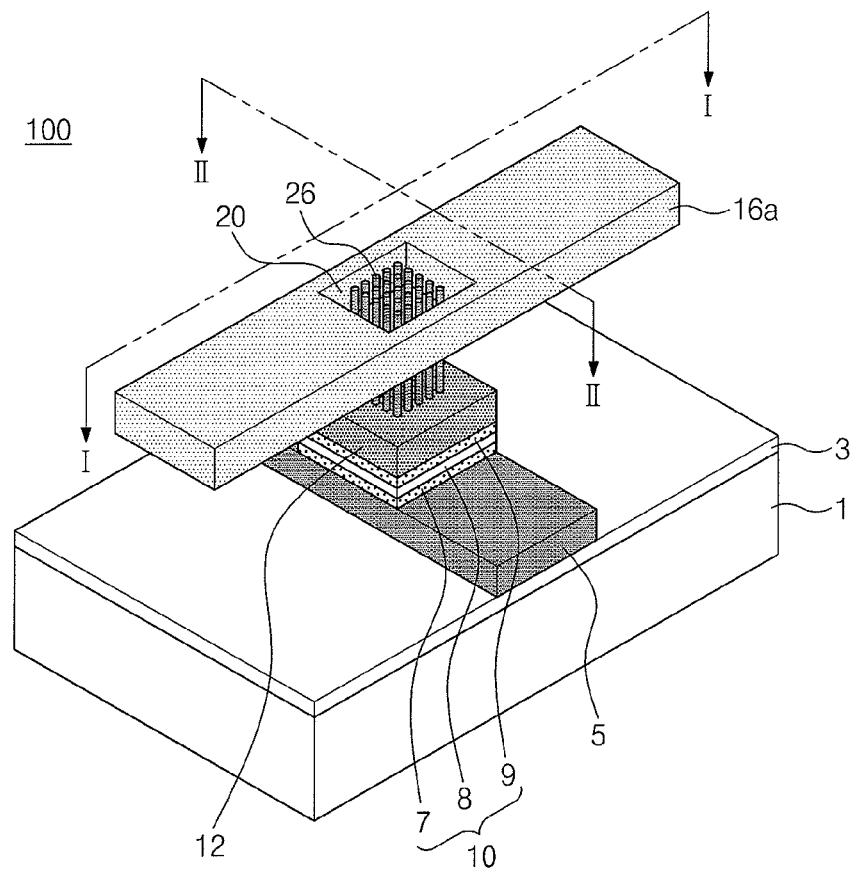
FIG. 17A is a perspective view illustrating a semiconductor memory device according an embodiment of the inventive concept.
Figure 17B:
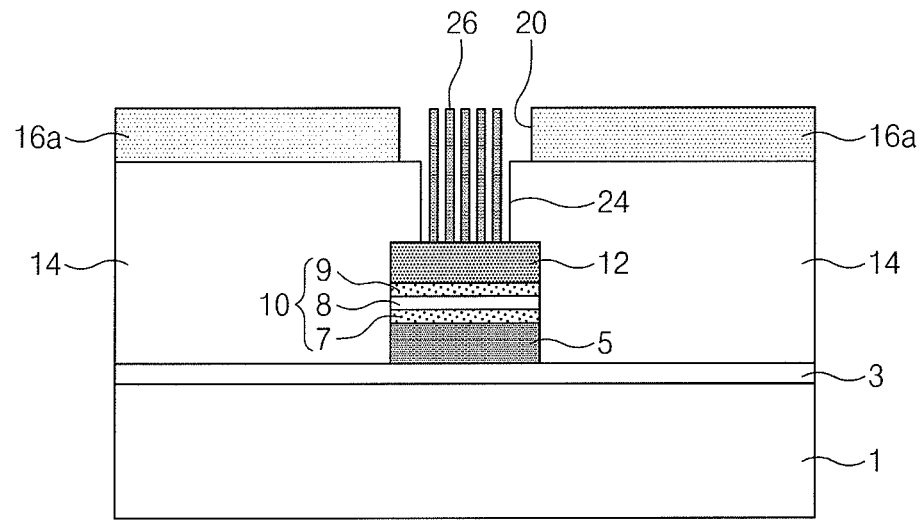
FIGS. 17B and 17C illustrate cross-sectional views taken along line I-I and line II-II of FIG. 17A, respectively.
Figure 17C:
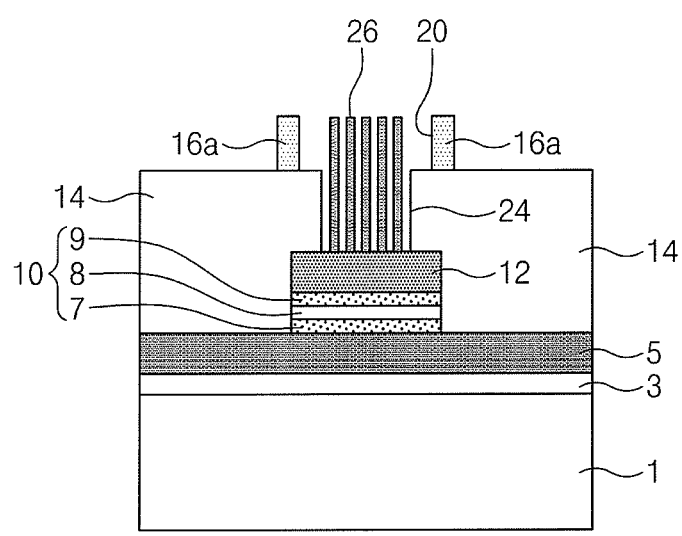

FIG. 17A is a perspective view illustrating a semiconductor memory device according to a second embodiment of the inventive concept. FIGS. 17B and 17C illustrate cross-sectional views taken along line I-I and line II-II of FIG. 17A, respectively. For clearer understanding, the interlayer dielectric film 14 illustrated in FIGS. 17B through 17C is omitted in FIG. 17A.

Referring to FIGS. 17A, 17B and 17C, the resistance variation part 10 may include a first layer 7, a second layer 8, and a third layer 9, which are sequentially stacked. For example, the first, second, and third layers 7, 8, and 9 may be a pinned layer, a tunneling layer, and a free layer, respectively. In this case, the semiconductor memory device may be an MRAM. The pinned layer may be constituted by an anti-ferromagnetic layer, and the free layer may be constituted by a ferromagnetic layer. For example, the tunneling layer may be an aluminum oxide film. In this case, the resistance variation part 10 may further include a seed layer and a pinning layer.

In another example, the first layer 7 and the third layer 9 may be a first electrode and a second electrode, respectively, and the second layer 8 may be a metal oxide film pattern or a solid electrolyte film pattern. In this case, the semiconductor memory device may be a ReRAM. When the second layer 8 is a metal oxide film pattern, an oxide of a transition metal such as, for example, nickel or niobium, or an aluminum oxide may be used as a metal oxide film of the metal oxide film pattern. In this case, the first and second electrodes may be formed of various conductive metals. Alternatively, when the second layer 8 is a solid electrolyte film pattern, the second layer 8 may include, for example, one of germanium telluride (GeTe), antimony telluride (SbTe), and germanium antimony telluride (GeSbTe) as a telluride compound. In this case, one of the first and second electrodes may include a metal such as copper, silver, and zinc, which have a tendency to diffuse metal ions into the solid electrolyte film pattern. Furthermore, in this case, the other of the first and second electrodes is an inert electrode that may be formed of a metal such as, for example, platinum, ruthenium, iridium, titanium, and tantalum, or a nitride thereof. In this case, the conductive pad 12 and the first conductive line 5 may be formed of various conductive materials.

The other configurations may be the same as those of the previous embodiment.

A Third Embodiment

Figure 18A:
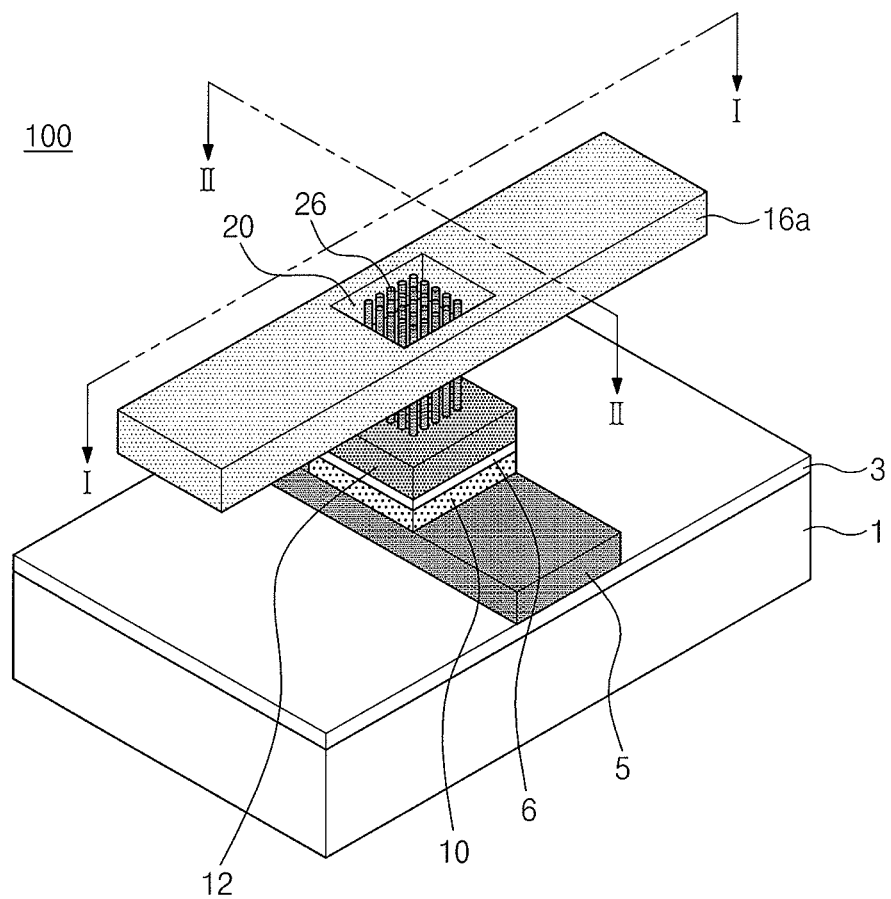
FIG. 18A is a perspective view illustrating a semiconductor memory device according to an embodiment of the inventive concept.
Figure 18B:
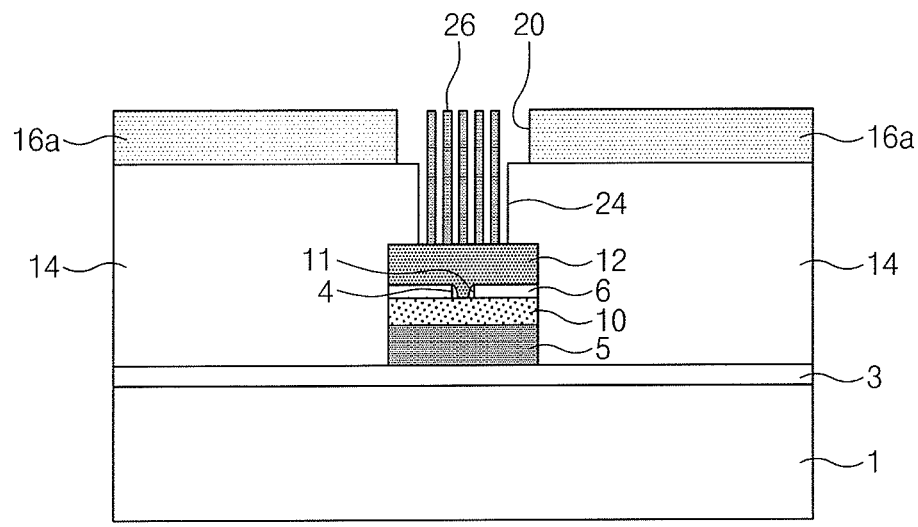
FIGS. 18B and 18C illustrate cross-sectional views taken along line I-I and line II-II of FIG. 18A, respectively.
Figure 18C:
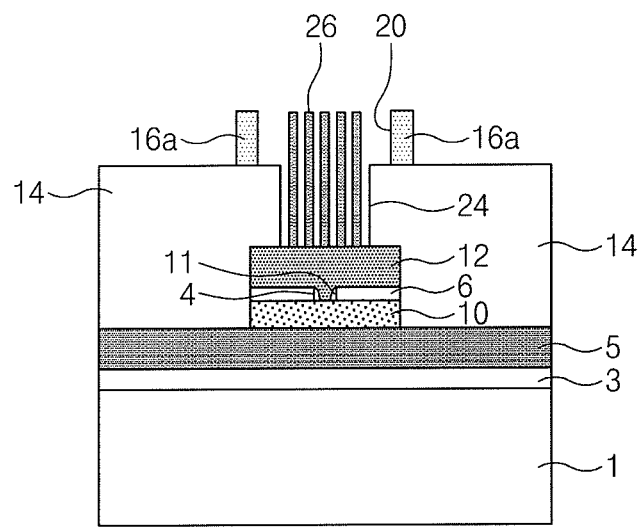

FIG. 18A is a perspective view illustrating a semiconductor memory device according to a third embodiment of the inventive concept. FIGS. 18B and 18C illustrate cross-sectional views taken along line I-I and line II-II of FIG. 18A, respectively. For clearer understanding, the interlayer dielectric film 14 illustrated in FIGS. 18B and 18C is omitted in FIG. 18A.

Referring to FIGS. 18A, 18B and 18C, the resistance variation part 10 according to the current embodiment may be a phase-change material pattern. For example, a phase-change material pattern may include a chalcogenide-based material. The semiconductor memory device according to the current embodiment may further include a dielectric film 6 that is disposed between the resistance variation part 10 and the conductive pad 12 and includes a contact window 4. Accordingly, the resistance variation part 10 may contact with the conductive pad 12 through the contact window 4. Accordingly, a contact area between the resistance variation part 10 and the conductive pad 12 may decrease to reduce a program current. A dielectric film spacer 11 may be disposed on a side wall of the contact window 4 to further reduce the contact area between the resistance variation part 10 and the conductive pad 12. The other configurations may be the same as those of the first embodiment.

A Fourth Embodiment

Figure 19A:
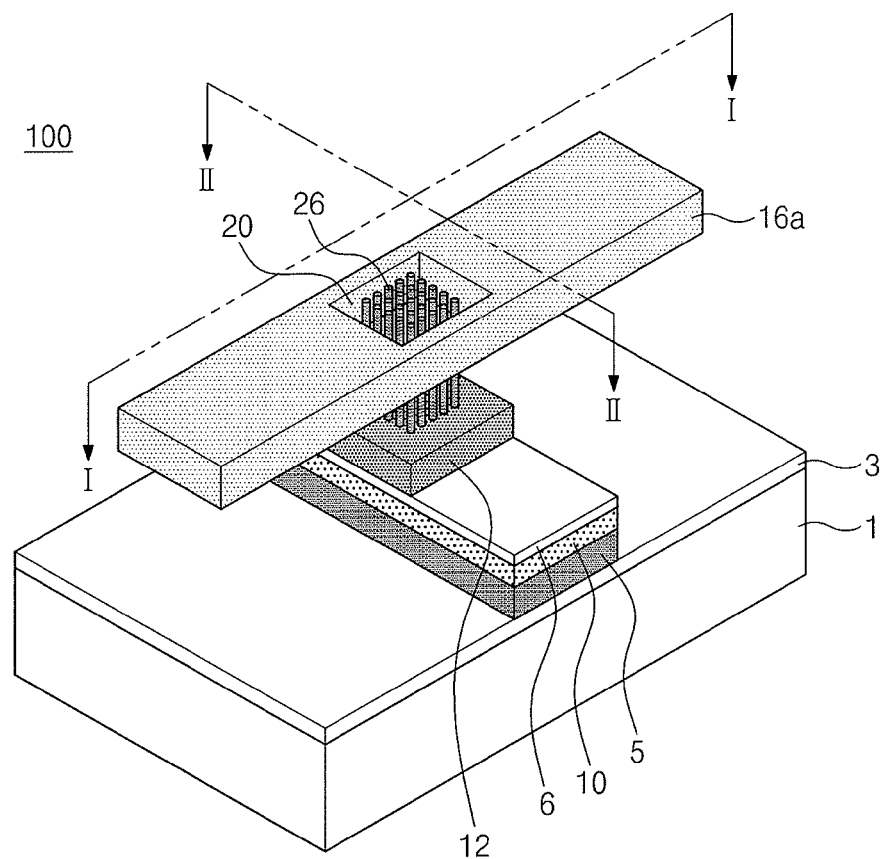
FIG. 19A is a perspective view illustrating a semiconductor memory device according to an embodiment of the inventive concept.
Figure 19B:
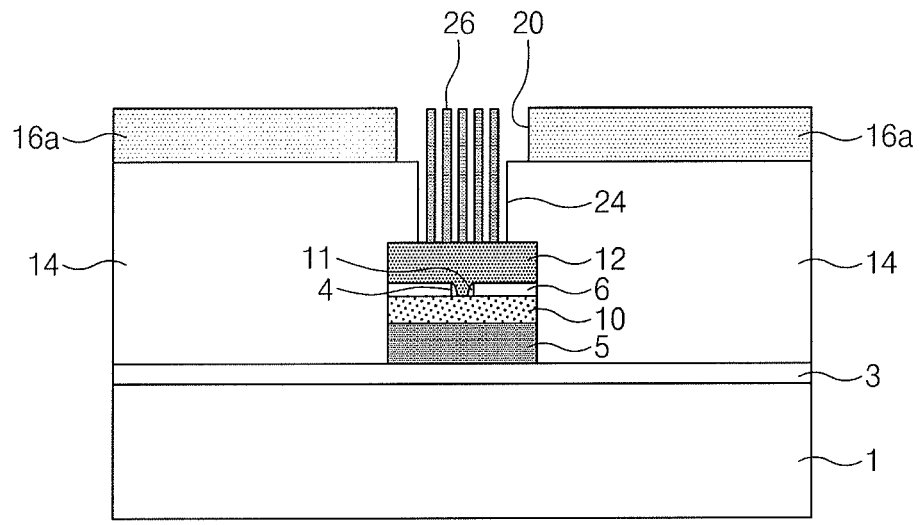
FIGS. 19B and 19C illustrate cross-sectional views taken along line I-I and line II-II of FIG. 19A, respectively.
Figure 19C:
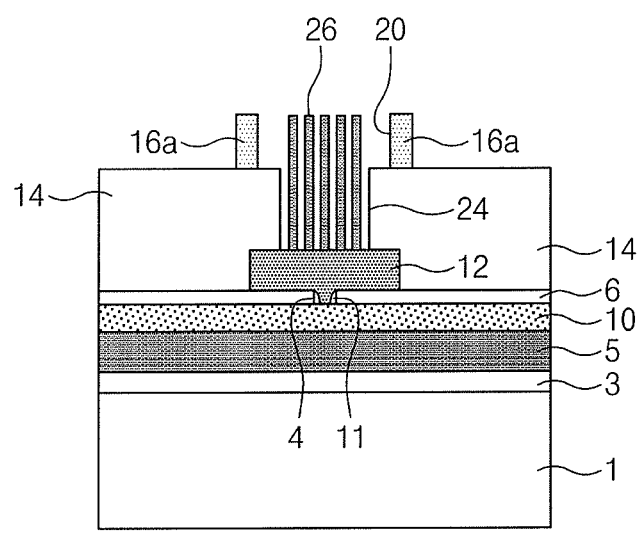

FIG. 19A is a perspective view illustrating a semiconductor memory device according to a fourth embodiment of the inventive concept. FIGS. 19B and 19C illustrate cross-sectional views taken along line I-I and line II-II of FIG. 19A, respectively. For clearer understanding, the interlayer dielectric film 14 illustrated in FIGS. 19B and 19C is omitted in FIG. 19A.

Referring to FIGS. 19A, 19B and 19C, as in the third embodiment, a resistance variation part 10 may be a phase-change material pattern, and the semiconductor memory device may include a dielectric film 6 that is disposed between the resistance variation part 10 and a conductive pad 12 and includes a contact window 4. However, the dielectric film 6 and the resistance variation part 10 may have line shapes that overlap a first conductive line 5. The resistance variation part 10 may extend in a line shape, and thus the resistance variation part 10 may contact with the conductive pad 12 through the contact window 4. The other configurations may be the same as those of the third embodiment.

A Fifth Embodiment

Figure 20A:
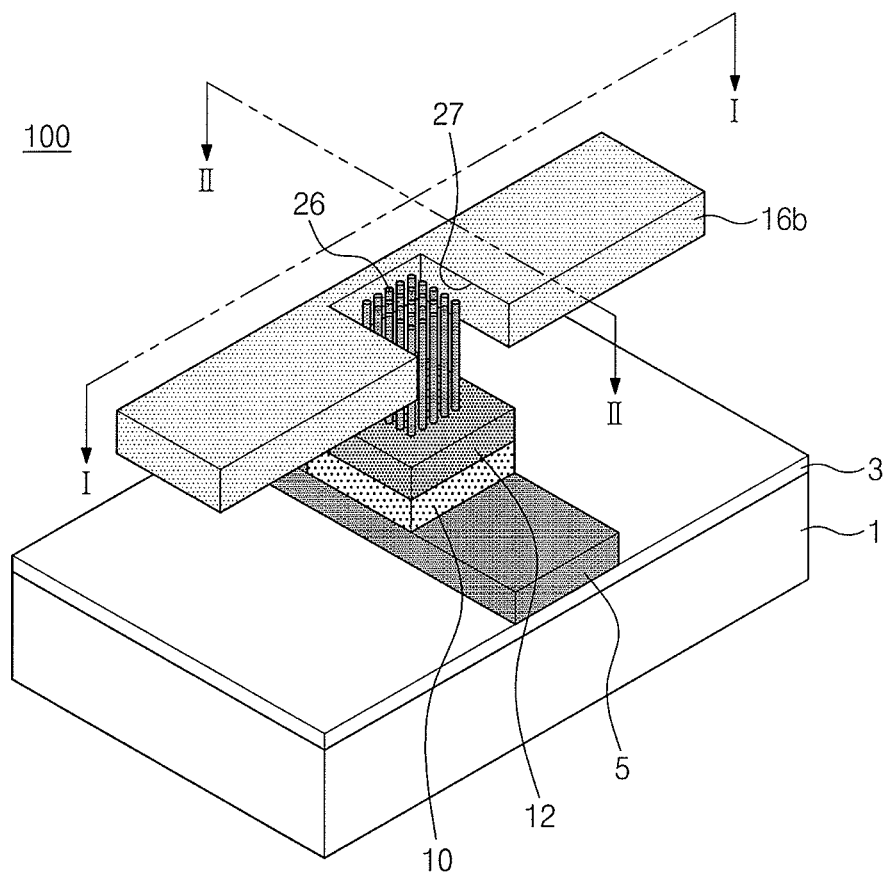
FIG. 20A is a perspective view illustrating a semiconductor memory device according to an embodiment of the inventive concept.
Figure 20B:
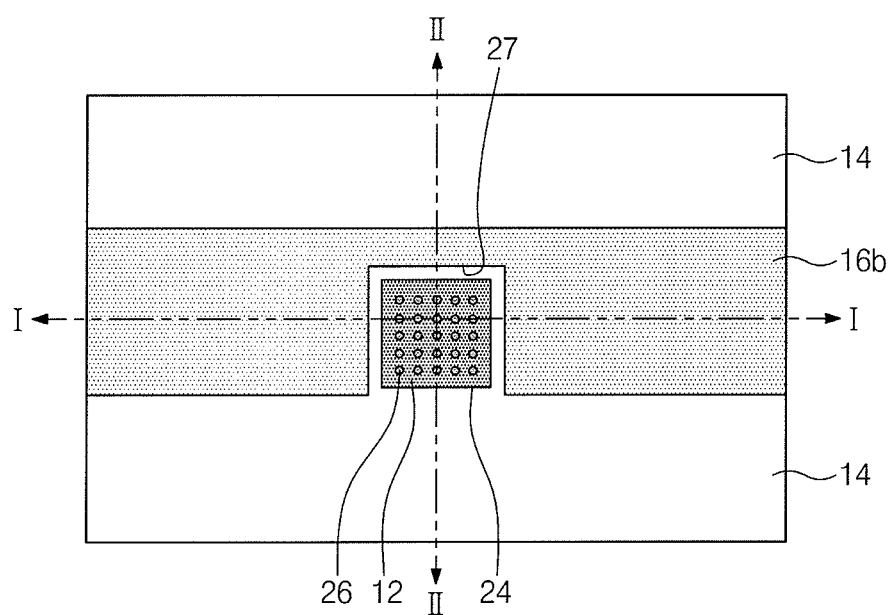
FIG. 20B is a plan view illustrating the semiconductor memory device of FIG. 20A.
Figure 20C:
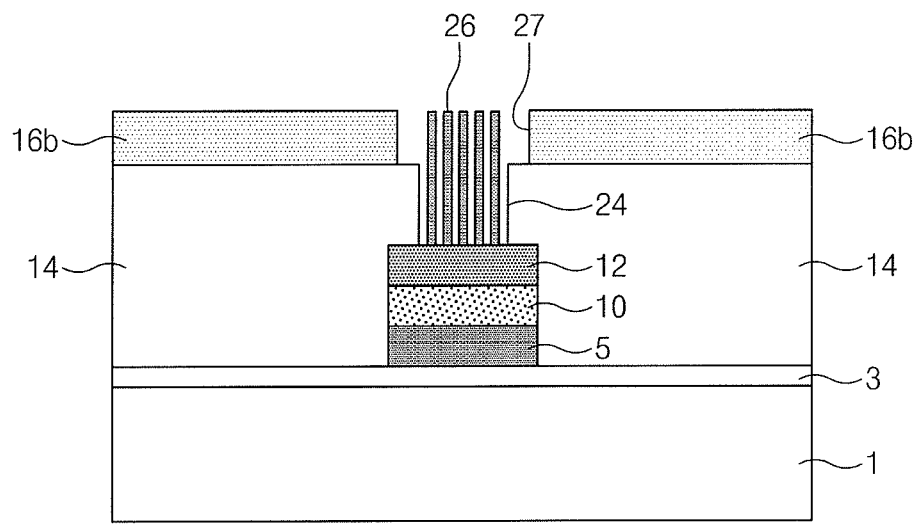
FIGS. 20C and 20D are cross-sectional views taken along line I-I and line II-II of FIG. 20A or 20B, respectively.
Figure 20D:
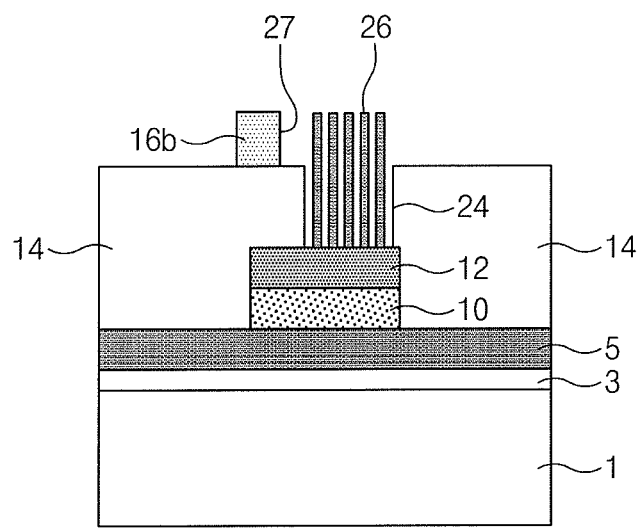

FIG. 20A is a perspective view illustrating a semiconductor memory device according to a fifth embodiment of the inventive concept. FIG. 20B is a plan view illustrating the semiconductor memory device of FIG. 20A. FIGS. 20C and 20D are cross-sectional views taken along line I-I and line II-II of FIG. 20A or 20B, respectively. For clearer understanding, the interlayer dielectric film 14 illustrated in FIGS. 20B through 20D is omitted in FIG. 20A.

Referring to FIGS. 20A, 20B, 20C and 20D, the semiconductor memory device according to the current embodiment may have a laterally curved region 27 in side surfaces of a second conductive line 16b, which surround a part of the side walls of the first opening part 24. Also in this case, a second distance between the side wall of the first opening part 24 and the second conductive line 16b may be greater than a first distance between the nanotubes 26 and the side wall of the first opening part 24. When a voltage is applied to the semiconductor memory device according to the current embodiment, ends of the nanotubes 26 adjacent to the laterally curved region 27 on the side walls of the second conductive line 16b may be bent toward the second conductive line 16b. The other configurations may be the same as those of the first embodiment.

A Sixth Embodiment

Figure 21A:
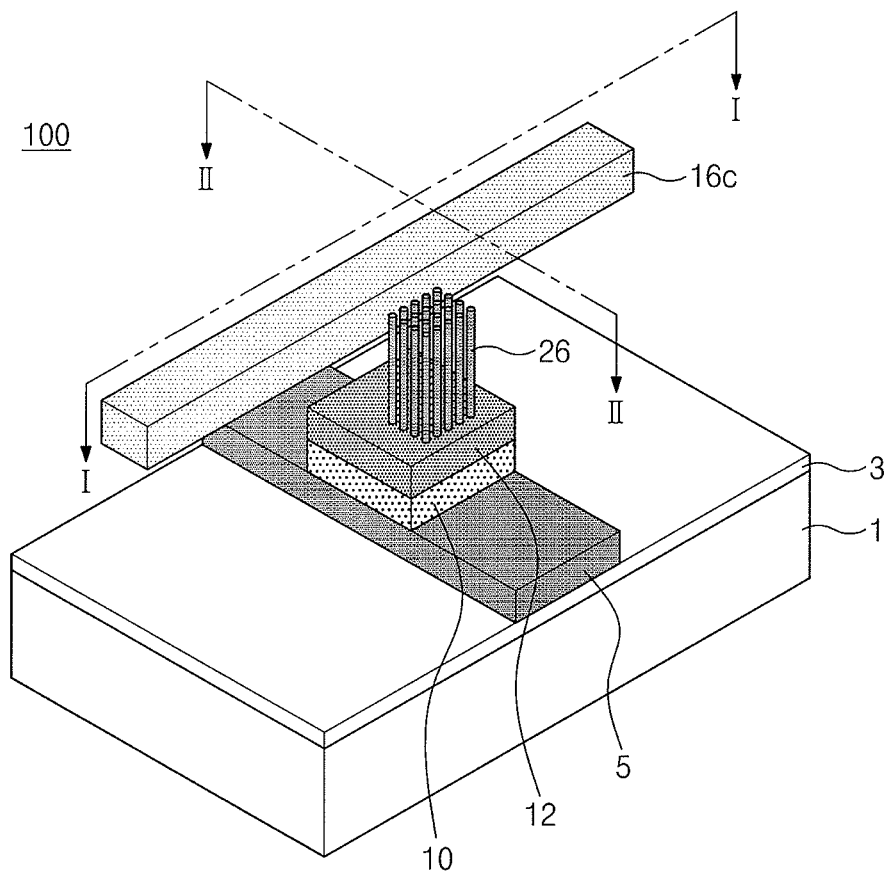
FIG. 21A is a perspective view illustrating a semiconductor memory device according to an embodiment of the inventive concept.
Figure 21B:
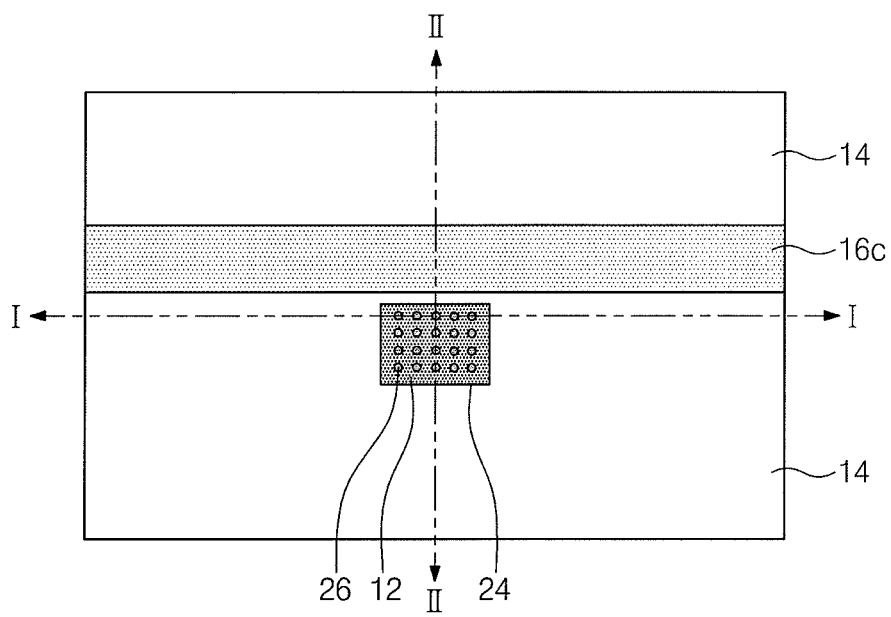
FIG. 21B is a plan view illustrating the semiconductor memory device of FIG. 21A.
Figure 21C:
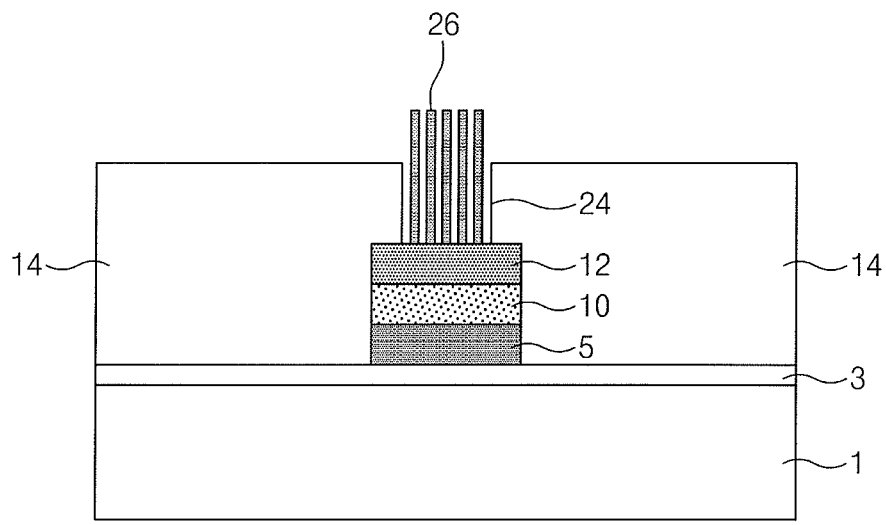
FIGS. 21C and 21D are cross-sectional views taken along line I-I and line II-II of FIG. 21A or 21B, respectively.
Figure 21D:
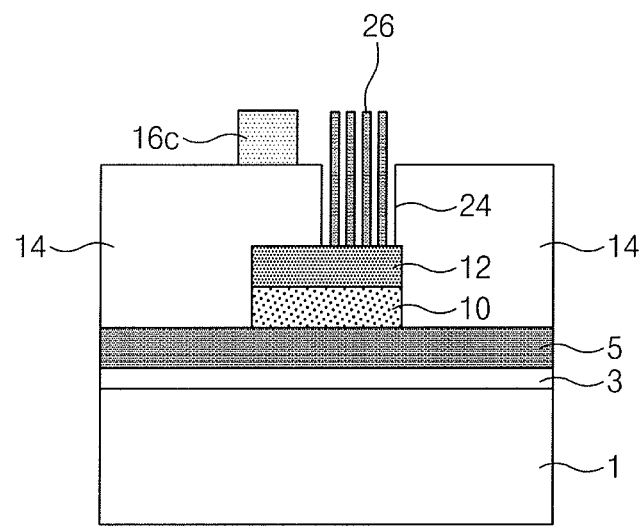

FIG. 21A is a perspective view illustrating a semiconductor memory device according to a sixth embodiment of the inventive concept. FIG. 21B is a plan view illustrating the semiconductor memory device of FIG. 21A. FIGS. 21C and 21D are cross-sectional views taken along line I-I and line II-II of FIG. 21A or 21B, respectively. For clearer understanding, the interlayer dielectric film 14 illustrated in FIGS. 21B through 21D is omitted in FIG. 21A.

Referring to FIGS. 21A, 21B, 21C and 21D, a second conductive line 16c without the second opening part 20 of the first embodiment or the laterally curved region 27 of the fifth embodiment may extend in a straight line shape near a side surface of a first opening part 24. In this case, when a voltage is applied to the semiconductor memory device according to the current embodiment, ends of the nanotubes 26 adjacent to the second conductive line 16*c* may be bent toward the second conductive line 16*c*. The other configurations may be the same as those of the first embodiment.

Application

Figure 22:
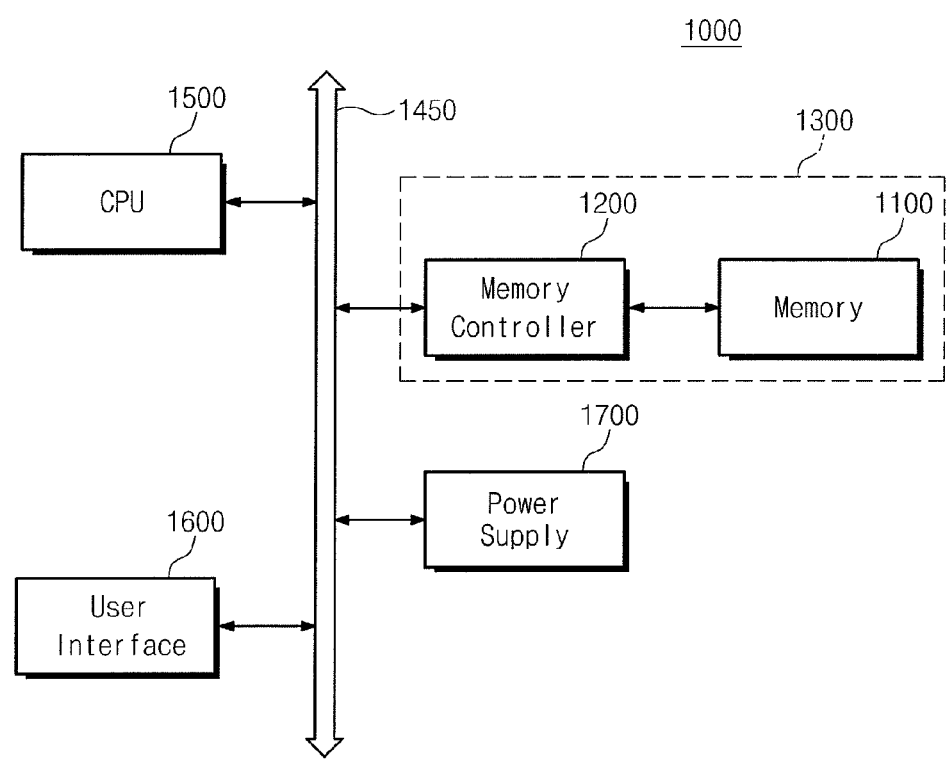
FIG. 22 is a block diagram of a memory system to which a semiconductor memory device according to an embodiment of the inventive concept is applied.

FIG. 22 is a block diagram of a memory system to which a semiconductor memory device according to embodiments of the inventive concept is applied.

Referring to FIG. 22, a memory system 1000 according to the inventive concept may include a semiconductor memory device system 1300 including a semiconductor memory device 1100 and a memory controller 1200, a central processing unit (CPU) 1500 electrically connected to a system bus 1450, a user interface 1600, and a power supply device 1700.

Data provided through the user interface 1600 or data processed by the central processing unit 1500 may be stored through the memory controller 1200 in the semiconductor memory device 1100. The semiconductor memory device 1100 may be constituted by a semiconductor disk device (SSD) that significantly increases the writing speed of the memory system 1000.

Although not shown, it is apparent to those skilled in the art that the memory system 1000 may further include, for example, an application chipset, a camera image processor (CIS), and a mobile DRAM.

The memory system 1000 may be applied to, for example, a personal digital assistant (PDA), a portable computer, a web tablet, a wireless phone, a mobile phone, a digital music player, a memory card, or all kinds of electronic devices for transmitting and/or receiving information via a wireless environment.

Moreover, a phase-change memory device or a memory system according to the inventive concept may be mounted as various types of packages. For example, a phase-change memory device or a memory system according to the inventive concept may be packaged and mounted using a method such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

In the semiconductor memory device according to one embodiment of the inventive concept, the nanotubes are connected as a mechanical switch to the memory cell such as the resistance variation part disposed at a junction of the two conductive lines. Such nanotubes can function as a mechanical switch to prevent a leakage current to an unselected memory cell, and can achieve a higher degree of integration than a semiconductor device including a transistor as a switch.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor memory device comprising:
a first conductive line;
a second conductive line crossing over the first conductive line;
a resistance variation part disposed at a position in which the second conductive line intersects with the first conductive line and electrically connected to the first conductive line and the second conductive line;
a mechanical switch disposed between the resistance variation part and the second conductive line, wherein the mechanical switch includes a nanotube;
a conductive pad disposed between the resistance variation part and the second conductive line and having an upper portion on which the nanotube is disposed; and
an interlayer dielectric film which is disposed on only a portion of an upper surface of the conductive pad and which covers side walls of the first conductive line, the resistance variation part, and the conductive pad, wherein the interlayer dielectric film has a first opening art partially exposing the upper surface of the conductive pad, and wherein the nanotube is disposed in the first opening part.

2. The semiconductor memory device of claim 1, wherein the resistance variation part comprises one of:
a phase-change material film pattern; a magnetic tunnel junction structure pattern including a pinned layer, a tunneling layer, and a free layer, which are sequentially stacked; a metal oxide film pattern; and a solid electrolyte film pattern.

3. The semiconductor memory device of claim 2, wherein the resistance variation part is the phase-change material film pattern, the semiconductor memory device further comprises a dielectric film that is disposed between the conductive pad and the phase-change material film pattern and has a contact window, and the conductive pad and the phase-change material film pattern contact each other through the contact window.

4. The semiconductor memory device of claim 2, wherein the resistance variation part is the solid electrolyte film pattern, and one of the conductive pad and the first conductive line comprises a metal film having a tendency to diffuse a metal ion into the solid electrolyte film pattern.

5. The semiconductor memory device of claim 1, wherein a second distance between a side wall of the first opening part and the second conductive line is greater than a first distance between the nanotube and the interlayer dielectric film.

6. The semiconductor memory device of claim 5, wherein the second distance is equal to or greater than two times the first distance.

7. The semiconductor memory device of claim 5, wherein the second conductive line comprises one of: a second opening part disposed at a position in which the second opening part overlaps the first opening part, and having a greater width than that of the first opening part; and a laterally curved region of a side surface surrounding a part of side walls of the first opening part.

8. The semiconductor memory device of claim 1, wherein, when a voltage is applied to the first conductive line and the second conductive line, the nanotube contacts the second conductive line to turn the mechanical switch on.

9. A semiconductor memory device comprising:
a buffer film disposed on a semiconductor substrate;
a first conductive line extending across the semiconductor substrate and disposed on the buffer layer;
a resistance variation part disposed on the first conductive line;

a conductive pad disposed on the resistance variation part;

an interlayer dielectric film which is disposed on only a portion of an upper surface of the conductive pad and covering sidewalls of the first conductive line, the resistance variation part and the conductive pad, wherein the interlayer dielectric film includes a first opening part that partially exposes the upper surface of the conductive pad;

a second conductive line that extends on the interlayer dielectric film and crosses an upper side of the first conductive line; and a mechanical switch comprising a plurality of carbon nanotubes which are vertically elongated and disposed on the upper surface of the conductive pad exposed by the first opening part.

10. The semiconductor memory device of claim 9, wherein the second conductive line has a second opening part that overlaps the first opening part and is wider than the first opening part.

11. The semiconductor memory device of claim 9, wherein the resistance variation part includes a pinned layer, a tunneling layer and a free layer which are sequentially stacked on the first conductive line.

12. The semiconductor memory device of claim 11, wherein the pinned layer is an anti-ferromagnetic layer, the free layer is a ferromagnetic layer and the tunneling layer is an aluminum oxide film.

13. The semiconductor memory device of claim 9, wherein the resistance variation part comprises a first layer, a second layer and a third layer sequentially stacked on the first conductive line, the first layer is a first electrode, the third layer is a second electrode and the second layer is a metal oxide film pattern or a solid electrolyte film pattern.

14. The semiconductor memory device of claim 13, wherein the solid electrolyte film pattern comprises one of gennanium telluride (GeTe), antimony telluride (SbTe) and germanium antimony telluride (GeSbTe).

15. The semiconductor memory device of claim 9, further comprising a dielectric film disposed between the resistance variation part and the conductive pad, wherein the dielectric film includes a contact window, wherein the resistance variation part contacts the conductive pad through the contact window and wherein a dielectric spacer is disposed on a side wall of the contact window.

16. The semiconductor memory device of claim 15, wherein the dielectric film and the resistance variation part have line shapes that overlap the first conductive line.

17. The semiconductor memory device of claim 9, wherein the second conductive line includes a laterally curved region in side surfaces of the second conductive line, which surround a part of sidewalls of the first opening part and wherein a second distance between the side wall of the first opening part and the second conductive line is greater than a first distance between the nanotubes and the side wall of the first opening part.

18. The semiconductor memory device of claim 9, wherein the second conductive line extends in a straight line shape near a side surface of the first opening part.

19. The semiconductor memory device of claim 1, wherein the interlayer dielectric film is in direct physical contact with the portion of the upper surface of the conductive pad and in direct physical contact with the side walls of the first conductive line, the resistance variation part, and the conductive pad.

20. The semiconductor memory device of claim 9, wherein the interlayer dielectric film is in direct physical contact with the portion of the upper surface of the conductive pad and in direct physical contact with the side walls of the first conductive line, the resistance variation part, and the conductive pad.

* * * * *